United States Patent [19]

Akazawa et al.

[11] 4,412,208

[45] Oct. 25, 1983

[54] DIGITAL TO ANALOG CONVERTER

[75] Inventors: Yukio Akazawa, Iruma; Yasuyuki Matsuya, Tokyo; Atsushi Iwata, Tokorozawa, all of Japan

[73] Assignee: Nippon Telegraph & Telephone Public Corporation, Tokyo, Japan

[21] Appl. No.: 299,120

[22] Filed: Sep. 3, 1981

[30] Foreign Application Priority Data

Sep. 16, 1980 [JP] Japan .................. 55-127239
Jul. 13, 1981 [JP] Japan .................. 56-108135
Jul. 13, 1981 [JP] Japan .................. 56-108137

[51] Int. Cl.$^3$ ............................................. H03K 13/02
[52] U.S. Cl. ........................ 340/347 DA; 340/347 CC
[58] Field of Search ............... 340/347 DA, 347 AD, 340/347 CC

[56] References Cited

U.S. PATENT DOCUMENTS

| | | | |
|---|---|---|---|
| 3,216,001 | 11/1965 | Hinrichs | 340/347 AD |
| 3,646,586 | 2/1972 | Kurz | 340/347 DA |
| 3,735,392 | 5/1973 | Kaneko | 340/347 AD |
| 3,995,266 | 11/1976 | Müller | 340/347 DA |
| 4,077,035 | 2/1978 | Yee | 340/347 DA |
| 4,290,050 | 9/1981 | Stakhov | 340/347 DA |
| 4,318,085 | 3/1982 | Waiteside | 340/347 DA |

OTHER PUBLICATIONS

Holloway "IEEE International Solid-State Circuits Conference", Feb. 19, 1976, pp. 106, 107.

*Primary Examiner*—C. D. Miller
*Attorney, Agent, or Firm*—Spencer, Kaye & Frank

[57] ABSTRACT

A digital to analog converter comprising a first digital to analog converter for generating an output signal of higher order bits; a second digital to analog converter for generating a full scale output as an output signal of lower order bits which is always larger than the output value (1 LSB) corresponding to one bit of a digital input at the least significant bit of the first digital to analog converter; adding means for adding the output signal from the first digital to analog converter to the output signal from the second digital to analog converter to form an analog output signal; and a code converter for applying to the first and second digital to analog converters an input code obtained by shifting a digital input signal applied to the first and second digital to analog converters by a given value such that the relationship between the digital input signal and the analog output signal is made substantially linear.

4 Claims, 24 Drawing Figures

Probability that Output Level Exists in Hatched Area   $1/2 \cdot 1/2 \cdot 1/2 \cdot 1/2 \Rightarrow 1-(1/2)^4$ Probability that Output Level Exists in Hatched Area   $1/2 \cdot 3/4 \cdot 1 \cdot 3/4 \Rightarrow 1$

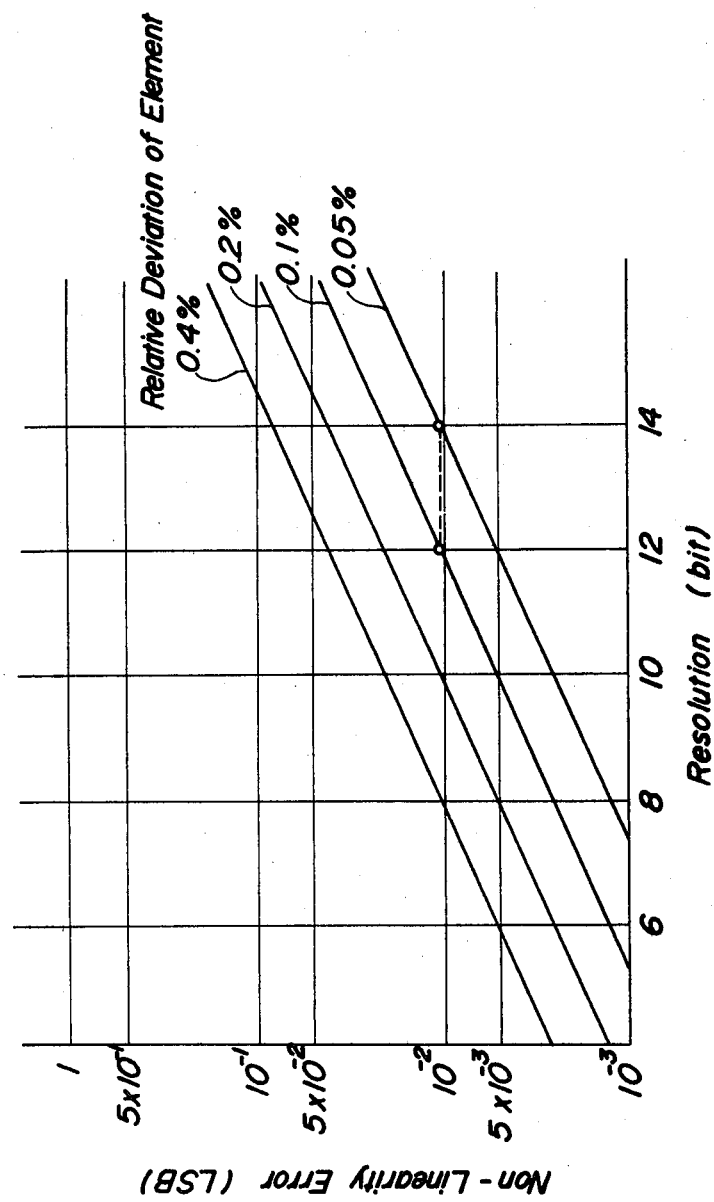

FIG.12

| Step | Operation | Bus Selector 106A | Bus Selector 106B |
|---|---|---|---|
| (1) | Din Latch | C | — |
| (2) | ROM105B Access and Addition | — | B |
| (3) | When A=mth bit is 1 | A | — |
| | When A=mth bit is 0 | B | — |
| (4) | Proceed to (2) as A=A-1 | — | — |
| (5) | ROM105A Access and Addition | — | A |
| (6) | Latch Addition Output | A | — |

DIGITAL TO ANALOG CONVERTER

BACKGROUND OF THE INVENTION

The present invention relates to an inexpensive, high accuracy digital to analog converter for converting a digital input signal into a substantially proportional analog signal to be used in various types of communication systems and control equipments.

Various proposals for fabricating a digital to analog converter (hereafter referred to as a DAC) in the form of an integrated circuit (IC) have been made. For example, Holloway et al, have proposed "A High Yield Second Generation 10 Bit Monolithic DAC" in 1976, IEEE, ISSCC, pp. 106-107, in February, 1976. In an integrated circuit, it is easy to make the matching tolerances of elements mounted on the same chip relatively small. Therefore, the integrated circuit is suitable for fabrication of the DAC. On the other hand, it is impossible in the IC to replace the elements once fabricated by a new element or elements or to adjust a specific element or elements. Therefore, there is a limit to improving the accuracy of the DAC. The accuracy of the DAC is 12 bits at most, if no calibration is provided, in the present state of technology in this technical field.

An analog trimming technique for directly adjusting element values has been proposed, as one approach to improving the DAC accuracy. The analog trimming technique successfully realizes 13- to 14-bit accuracy but requires an increased number of process steps for trimming components, an increased number of external pins, a complicated trimming process designed trimming device. In this respect, this approach is not advantageous from an economical viewpoint.

Another approach which has recently been proposed is a digital trimming technique for digitally calibrating total accuracy without any analog trimming of components. The approach aims at realizing the analog trimming process by means of logic circuits including ROM, RAM, digital adder and the like, which can easily be realized in the form of an IC. The approach by the digital trimming method is advantageous in that an economical IC construction is employed and the digital trimming does not require specially designed electrical devices.

In order to improve the non-linearity error of the DAC, in the digital trimming method, an analog output satisfying the required linearity is selected from outputs of a DAC with high resolution but an insufficient linearity (referred to as an original DAC), and the digital input of the original DAC is stored in a proper memory in a manner such that the selected output signal is obtained. The digital input signal of the original DAC which is stored as a digital signal corresponding to the output level is read out to drive the DAC, so that a DAC with a satisfactory linearity but a lower resolution than the original DAC is constructed.

Normally, DAC errors arise primarily from variations in the values of the weighting elements at higher order bits due to manufacturing variability of the weighting elements. Let us consider a case where bits ranging from the least significant bit (LSB) to the Lth bit as counted from the LSB are correctly weighted so that there is no error in this bit ranging, but the bits from the (L+1)th bit to the most significant bit (MSB) are erroneously weighted so that a weighting error occurs. In this case, the transfer characteristic of the DAC has a large transition or a jump at a carry point from the Lth bit to the (L+1)th in the code of the input signal to the DAC. Thus, a conventional digital calibration technique for the DAC calibrates by adding or subtracting an analog quantity of a deviation from an ideal characteristic. To this end, an analog calibrating signal produced from an additional calibrating DAC is applied to an adder/subtractor for the calibration. The calibrating operation is digitally performed by storing the input code to the additional DAC and a control signal for the analog adder/subtractor into an ROM or RAM. An example of this type of DAC is disclosed in U.S. Pat. No. 3,995,266.

In this type of DAC, it is difficult to perform error correction of the analog adder/subtractor and this impossibility prevents a high accuracy of digital to analog conversion. Therefore, to improve the linearity, a high accuracy adder/subtractor and an additional DAC are required. Particularly, in order to obtain the analog addition/subtraction function, a polarity inverting circuit and a control circuit for addition/subtraction are required. This makes it difficult to improve the accuracy and to reduce the chip area.

SUMMARY OF THE INVENTION

Accordingly, an object of the present invention is to provide a digital to analog converter which operates at a high speed without deterioration of speed due to access time of the ROM or RAM, and performs the trimming by digital processing without requiring analog circuits like the analog adder/subtractor and the additional DAC which prevent the attainment of high accuracy and reduction of chip area.

Another object of the present invention is to provide a compact and high speed digital to analog converter which narrows the allowance for a non-linearity error of an original DAC for realizing a required accuracy and which regularly arranges calibration values so that effective and simple digital trimming is performed.

Yet another object of the present invention is to provide an analog to digital converter in which the digital to analog converting speed is high and the capacity of an associated memory circuit is reduced.

Still another object of the present invention is to provide a digital to analog converter which is suitable for fabrication in the form of an integrated circuit.

To achieve the above objects, in one aspect of the present invention, there is provided a digital to analog converter which comprises a first digital to analog converter for generating an output signal of higher order bits, a second digital to analog converter for generating a full scale output as an output signal of lower order bits which is always larger than every quantizing level of the first digital to analog converter, adding means for adding the output signal from the first digital to analog converter to the output signal from the second digital to analog converter, and a code converter for applying to the first and second digital to analog converters an input code obtained by shifting a digital input signal applied to the first and second digital to analog converters by a given value such that the relationship between the digital input signal and the analog output signal is made substantially linear.

Here, the first digital to analog converter may preferably comprise a first capacitor array arranged with binary weighting corresponding to a train of higher order bits of the digital input signal and a first analog switch array for controlling the connection of each of the capacitors of the first capacitor array to a reference voltage or ground, and the second digital to analog converter may comprise a second capacitor array arranged with binary weighting corresponding to a train of lower order bits of the digital input signal and a second analog switch array for controlling the connection of each of the capacitors of the second capacitor array to the reference voltage or ground. The terminals of the respective capacitors of the first array which are opposite to their terminals connected to the first analog switch array are connected in common and its common connection point is used as an output point of the first digital to analog converter. The terminals of the respective capacitors of the second capacitor array which are opposite to their terminals connected to the first analog switch array are connected in common and its common connection point is used as an output point of the second digital to analog converter. The output points of the first and second digital to analog converters are connected by a coupling capacitor and the capacitance of the coupling capacitor is selected in such a manner that an equivalent capacitance when the second digital to analog converter including the coupling capacitor is viewed from the output point of the first digital to analog converter is larger than the unit capacitance of the first digital to analog converter.

In a preferred embodiment of the invention, the code converter may comprise a first memory circuit for storing a shift code when only one bit of a plurality of bits forming the input code to the first digital to analog converter is 1, a digital adder for sequentially performing digital addition of the shift code read out from the first memory circuit, a first selector for selectively deriving either one of the input code, and the preceding addition output and the present addition output from the digital adder, a latch for latching an output signal selectively derived from the first selector to apply the latched output as an output signal from the code converter to the first and second digital to analog converters, and a sequencer for controlling so as to read out from the first memory circuit the shift code sequentially from a shift code with respect to higher order bits of the plurality of bits, to judge whether or not the shift code when only one bit of the plurality of bits forming the input code to the first digital to analog converter is 1 is added to the input code, and to accumulate the shift code when the addition is made thereby to add the accumulated output to the input code and to latch the addition output in the latch.

In another preferred embodiment of the invention, the code converter may comprise a first memory circuit for storing a shift code when only one bit of a plurality of bits forming the input code to the first digital to analog converter is 1, a second memory circuit for storing the shift code with respect to a non-linearity error that is generated by a cause other than miss weighing components, and corresponding to an input code to the first digital to analog converter, a digital adder/subtractor for sequentially performing digital addition and subtraction of the shift code read out from the first memory circuit, a first selector for selectively deriving either one of the input code, and the preceding addition/subtraction output and the present addition/subtraction output from the digital adder/subtractor, a second selector for selecting one of the outputs of the first and second memory circuits, a latch for latching an output signal selectively derived from the first selector to apply the latched output as an output signal from the code converter to the first and second digital to analog converters, and a sequencer for controlling so as to read out from the first memory circuit the shift code sequentially from a shift code with respect to higher order bits of the plurality of bits, to judge whether or not the shift code when only one bit of the plurality of bits forming the input code to the first digital to analog converter is 1 is added to/subtracted from the input code, and to accumulate the shift code when the addition is made thereby to add/subtract the accumulated to/from the input code and to latch the addition/subtraction output in the latch.

The digital adder/subtractor responds to the code converter output signal from the latch to read out the shift code based upon the non-linearity error from the second memory circuit, and performs an addition when the shift code is positive, and a subtraction when the shift code is negative.

In yet another preferred embodiment of the invention, the code converter may comprise a change point generator for previously storing, corresponding to each area of each digital quantity obtained by equally segmenting a digital to analog converting characteristic of the original digital to analog converter by a resolution two times higher than that of the first digital to analog converter, a change point where a shift code in the corresponding area in the characteristic calibrated by the code shifting in the code converter is changed, and for responding to a part of the digital input signal to read out data of the change point, a comparator for comparing the part of the digital input signal with the data of the change point from the change point generator to designate the selection of either one of the two shift codes when there are two kinds of shift codes in the area, a shift code generator for previously storing, corresponding to the area, the shift code when there is one kind of shift code in the corresponding area and the shift code designated by the comparator when there are two kinds of shift codes in the corresponding area, and for responding to the digital input signal to read out a predetermined shift code, and an adder for performing digital addition of the shaft code read out from the shift code generator and the digital input signal thereby to supply the result of the addition to the first and second digital to analog converters.

In another aspect of the present invention, a digital to analog converter comprises an original digital to analog converter for producing a full scale output of a lower order bit part which is always larger than every quantizing level of a higher order bit part, and a code converter for applying to the original digital to analog converter an input code obtained by shifting the digital input signal by a predetermined value so that the relationship between the digital input signal and an analog output signal of the original digital to analog converter is substantially linear. Here, it is preferable that the original digital to analog converter includes a capacitor array arranged with binary weighting corresponding to a train of higher and lower order bits of the digital input signal and an analog switch array for controlling the connection of each of the capacitors of the capacitor array to a reference voltage or ground. The terminals of the capacitors of the capacitor array which are opposite to their terminals connected to the analog switch array is connected in common and its common connection point is used as an output point of the original digital to analog converter, from which a digital to analog converting output is derived.

In a preferred embodiment of the invention, the code converter may comprise a first memory circuit for storing a shift code when only one bit of a plurality of bits forming the input code to the higher order bits part of the original digital to analog converter is 1, a digital adder for sequentially performing digital addition of the shift code read out from the first memory circuit, a first selector for selectively deriving any one of the input code, and the preceding addition output and the present addition output from the digital adder, a latch for latching an output signal selectively derived from the first selector to apply the latched output as an output signal from the code converter to the original digital to analog converter, and a sequencer for controlling so as to read out from the first memory circuit the shift code sequentially from a shift code with respect to higher order bits of the plurality of bits, to judge whether or not the shift code when only one bit of the plurality of bits forming the input code to the higher order bit part of the original digital to analog converter is 1 is added to the input code, and to accumulate the shift code when the addition is made thereby to add the accumulated output to the input code and to latch the additional output in the latch.

In another preferred embodiment of the invention, the code converter may comprise a first memory circuit for storing a shift code when only one bit of a plurality of bits forming the input code to the higher order bit part of the original digital to analog converter is 1, a second memory circuit for storing the shift code with respect to a non-linearity error that is generated by a cause other than miss weighing components, and corresponding to an input code to the higher order bit part of the original digital to analog converter, a digital adder/subtractor for sequentially performing a digital addition and subtraction of the shift code read out from the first memory circuit, a first selector for selectively deriving either one of the input code, and the preceding addition/subtraction output and the present addition/subtraction output from the digital adder/subtractor, a second selector for selecting one of the outputs of the first and second memory circuits, a latch for latching an output signal selectively derived from the first selector to apply the latched output as an output signal from the code converter to the original digital to analog converter, and a sequencer for controlling so as to read out from the first memory circuit the shift code sequentially from a shift code with respect to higher order bits of the plurality of bits, to judge whether or not the shift code when only one bit of the plurality of bits forming the input code to the higher order bit part of the original digital to analog converter is 1 is added to/subtracted from the input code, and to accumulate the shift code when the addition/subtraction is made thereby to add/subtract the accumulated output to/from the input code and to latch the addition/subtraction output in the latch. The digital adder/subtractor responds to the code converter output signal from the latch to read out the shift code based upon the non-linearity error from the second memory circuit, and performs an addition when the shift code is positive, and a subtraction when the shift code is negative.

In an additional preferred embodiment of the invention, the code converter may comprise a change point generator for previously storing, corresponding to each area of each digital quantity obtained by equally segmenting a digital to analog converting characteristic of the original digital to analog converter by a resolution two times higher than that of the original digital to analog converter, a change point where a shift code in the corresponding area in the characteristic calibrated by the code shifting in the code converter is changed, and for responding to a part of the digital input signal to read out data of the change point, a comparator for comparing the part of the digital input signal with the data of the change point from the change point generator to designate the selection of either one of the two shift codes when there are two kinds of shift codes contained in the area, a shift code generator for previously storing, corresponding to the area, the shift code when there is one kind of shift code in the corresponding area and the shift code designated by the comparator when there are two kinds of shift codes in the corresponding area and for responding to the digital input signal to read out a predetermined shift code, and an adder for performing digital addition of the shift code read out from the shift code generator and the digital input signal thereby to supply the result of the addition to the original digital to analog converter.

Other objects and features of the present invention will be apparent from the following description in connection with the accompanying drawings, in which:

BRIEF DESCRIPTION OF THE DRAWINGS

FIG. 2 is a graph illustrating the result of a Monte Carlo analysis of the element matching tolerance of a capacitor array DAC and an error of the DAC;

FIG. 12 is an explanatory diagram illustrating operations of the sequencer in the code converter shown in FIG. 11;

DESCRIPTION OF THE PREFERRED EMBODIMENTS

In a DAC using the digital trimming method, an original DAC is required to have the following conditions with respect to its characteristic. That is, in order to obtain, by selecting proper outputs from discrete outputs of the original DAC, a DAC which has a satisfactory linearity even though the DAC has a lower resolution than the original DAC, the original DAC must have a series of such proper output levels.

Figure 1A:
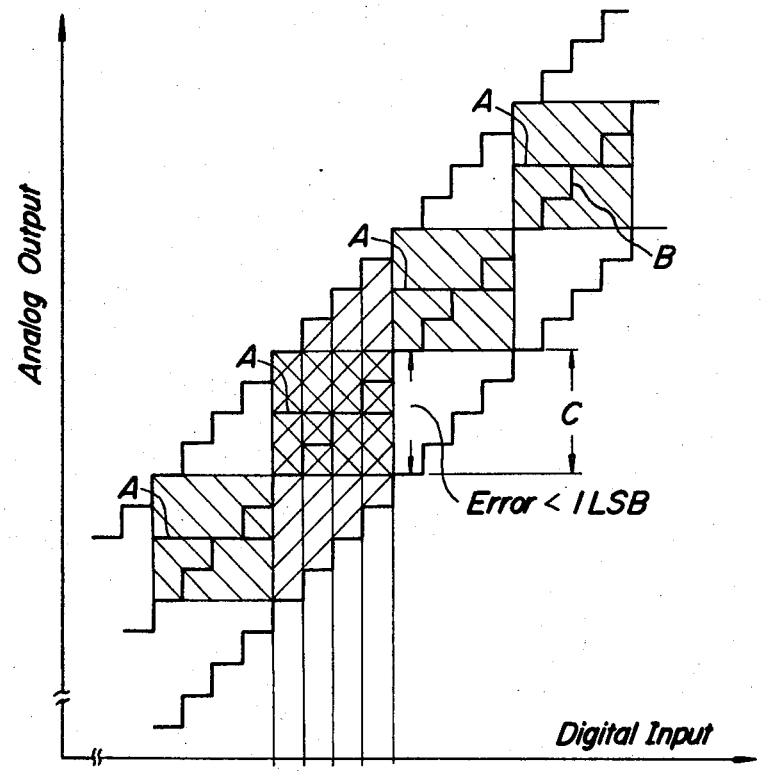
FIGS. 1A and 1B are explanatory diagrams for illustrating an error of an original DAC and the possibility of its trimming in a conventional DAC.
Figure 1B:
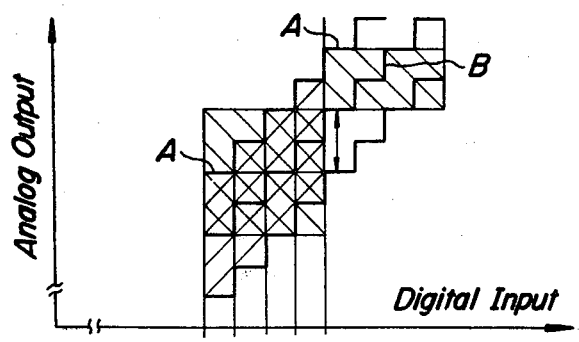

An allowable range for the output levels produced when the error of the original DAC is limited within 1 LSB of the DAC under trimming is illustrated in FIG. 1A. In FIG. 1A, reference character A designates the ideal output level of a DAC to be formed, B an ideal characteristic of the original DAC and C a 1 LSB of a DAC to be obtained under trimming. Also, in FIG. 1A, at least one output level must exist in a hatched area defined by $\pm\frac{1}{2}$ LSB with respect to the ideal output level A. The probability that this output level exists in the hatched area is $1-(\frac{1}{2})^4 \simeq 93.75\%$, as seen from FIG. 1A. Accordingly, the above conditions cannot be perfectly satisfied. To fully satisfy the conditions, the non-linearity error of a DAC under trimming must be within $\pm\frac{1}{2}$ LSB, as shown in FIG. 1B. The probability of the presence of a given output level in the hatched area in FIG. 1B is $1-\frac{1}{4}\times 0\times\frac{1}{4}\times\frac{1}{2}=1$. In this case, the conditions are perfectly satisfied.

In general, if the resolution of a DAC is increased while unit elements forming weighting elements in the DAC have equal matching tolerances, the absolute value of the error is reduced corresponding to the increase of the resolution. Therefore, even if the matching tolerance provides an unsatisfactory linearity at the resolution of the DAC under trimming, the linearity error of the original DAC can be limited within $\pm\frac{1}{2}$ LSB, if the original DAC has a resolution which is relatively higher than that of the DAC under trimming, so that a satisfactory linearity of the DAC under trimming can be obtained by the above-described trimming. On the other hand, the fact that the linearity error is limited within the range of $\pm\frac{1}{2}$ LSB of the DAC under trimming by increasing the resolution means an increase in the number of the unit elements. In other words, the matching tolerance is reduced to $1/\sqrt{n}$ corresponding to the increased number (n times) of unit elements. Thus, in this method, the error is made small by reducing the matching tolerance.

FIG. 2 illustrates the relationship between the matching tolerance of a unit element and the output non-linearity error obtained by a Monte Carlo analysis with respect to a simple capacitor DAC in which unit capacitors are weighted 1, 2, 4, 8, . . . . When the resolution is changed, for example, from 12 bits to 14 bits, that is, the number of unit elements is increased four times, the non-linearity error is equal to that obtains when the matching tolerance is reduced to a half time. Accordingly, to perfectly ensure the trimming by the above-mentioned method means that a desired linearity must be obtained. Therefore, the trimming method does not perform actual trimming. An effect of digital the trimming method resides in that a DAC with a resolution as high as possible and a satisfactory linearity is obtained from an original DAC with a poor performance by a simple trimming process. The conventional method, however, has a problem in that digital trimming has unsuccessfully be conducted, as mentioned above. The existence of a proper level is a matter of probability. Therefore, as the linearity of the original DAC becomes poorer, the calibrating process of finding the proper level is made more complicated and difficult. As a result, the trimming is effectively performed, since the digital trimming is essentially associated with a complicated trimming process.

Figure 3:
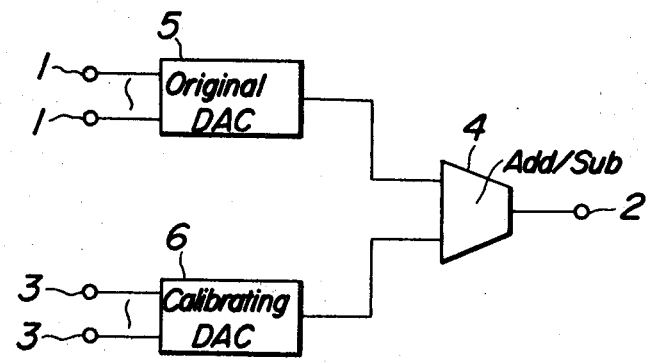
FIG. 3 is a block diagram showing the construction of a digital trimming DAC of conventional technology.

In order to solve such the problem to improve the trimming efficiency as much as possible, a construction shown in FIG. 3 has been employed in conventional technology. In FIG. 3, reference numeral 1 designates a digital input signal terminal, 2 an analog output signal terminal, 3 an input terminal of an additional DAC, 4 an analog adder/subtractor, 5 an original DAC, and 6 an additional DAC for generating a value corresponding to the linearity error of the original DAC 5. The linearity error is removed by the adder/subtractor 4. In this case, the following condition is required for the additional DAC 6. If it is assumed that the adder/subtractor 4 produces no error, the characteristic of the additional DAC 6 must be such that its step value is 1 LSB of the DAC subject to trimming, that its error is $\pm\frac{1}{4}$ LSB or less, and that the full scale is larger than the maximum error of the original DAC 5. This conventional technology arrangement, however, presents a problem in actually designing the additional DAC 6, since the resolution of the additional DAC 6 must be selected by taking account of the maximum error of the original DAC 5. Further, an error of the analog adder/subtractor 4 cannot be subject to trimming, so that there is the serious problem that the accuracy of the DAC is not improved by the digital trimming method.

The conventional trimming method as described above has an increased number of error sources such as the additional DAC and the adder/subtractor, and it is difficult to reduce the error in the present state of circuit technology. Therefore, there is a limit in improving the DAC accuracy by trimming, so that the trimming is not performed effectively.

In order to solve these problems, a digital to analog converter according to the present invention comprises a DAC for generating an output of higher order bits and a DAC for generating an output of lower order bits and the outputs of those DACs are added to form a DAC output. In a characteristic of this digital to analog converter, the DAC output is always reduced at the time that a carry is produced from the lower order bits to the higher order bits.

Figure 4:
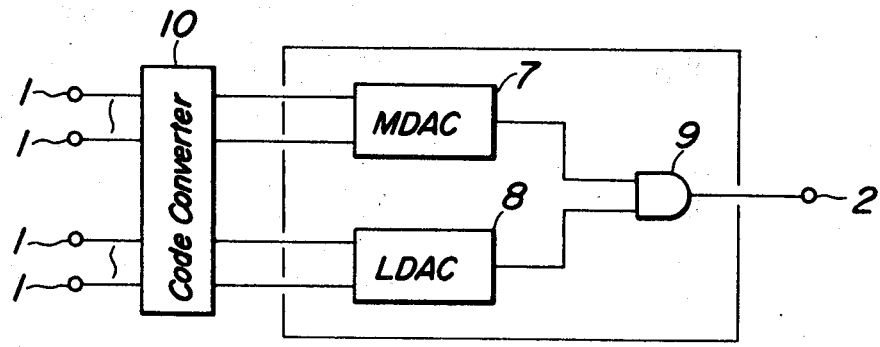
FIG. 4 is a block diagram showing the fundamental construction of a DAC according to the present invention.

FIG. 4 is a block diagram explaining a fundamental principle of the present invention, in which reference numeral 1 designates a digital input signal terminal, 2 an analog output signal terminal, 7 a DAC (referred to as (MDAC) for producing an output corresponding to a higher order bit input, 8 a DAC (referred to as LDAC) for producing an output corresponding to a lower order bit input, 9 an analog adder/subtractor, and 10 a code converter.

Figure 5:
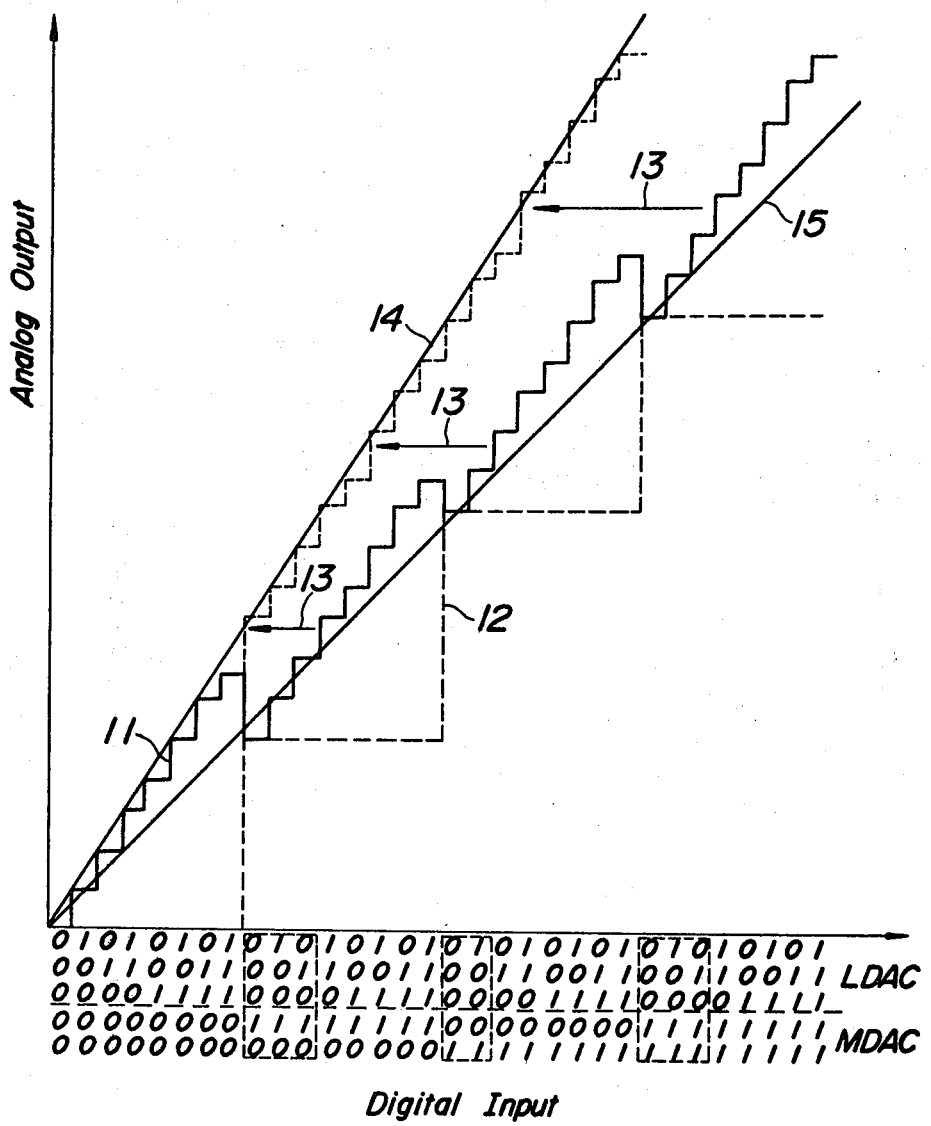
FIG. 5 is an explanatory diagram for explaining how to improve the accuracy of a DAC in the present invention.

In the circuit arrangement, when the full scale of the LDAC 8 is larger than 1 LSB of the MDAC 7 and its linearity is satisfied at the resolution of the LDAC 8, there is obtained a characteristic in which the DAC output signal is reduced when a carry is produced from the LDAC 8 to the MDAC 7. An example of such a characteristic of the DAC is illustrated in FIG. 5. In FIG. 5, reference numeral 11 designates the digital input versus analog output characteristic of the LDAC 8, 12 the digital input versus analog output characteristic of the MDAC 7, 13 the shift code of the digital input, 14 an input versus output characteristic of the DAC when the digital input is shifted, and 15 the ideal characteristic of the original DAC. The overall characteristic of the DAC arrangement has a jump in the negative direction, as shown in FIG. 5, when a carry is produced from the LDAC 8 to the MDAC 7, and each segment of the overall characteristic curve is formed by superposing the characteristic curve of the LDAC 8 on each step of the characteristic curve of the MDAC 7, with the position of the jump as the starting point of the superposition. As seen from the graph, if the digital input is shifted by an amount indicated by arrows 13 and in the direction of the arrows 13, a characteristic curve satisfying the linearity of the characteristic 14 is obtained. The shift of the digital input is carried out by the code converter 10 (FIG. 4).

Figure 6:
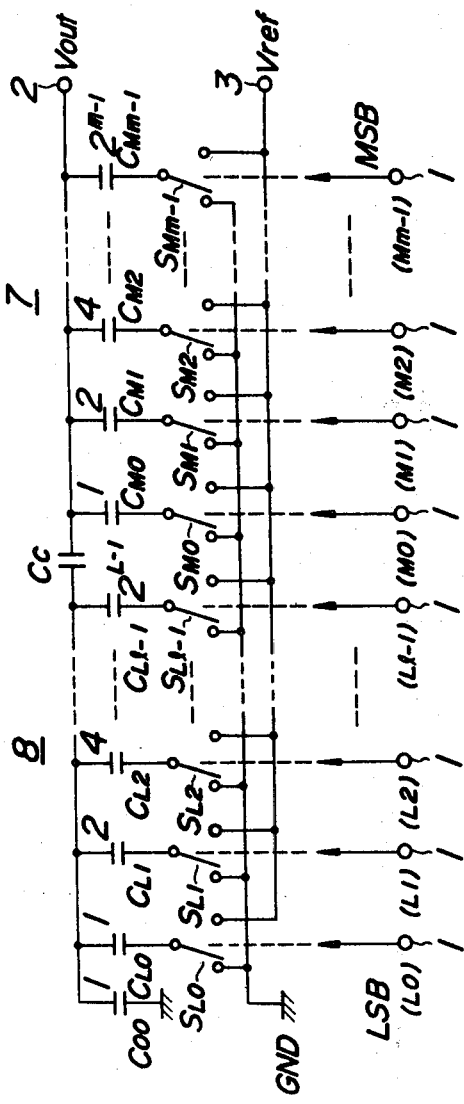
FIG. 6 is a circuit diagram showing an embodiment of a DAC according to the present invention.

Turning now to FIG. 6, there is shown an embodiment of a digital to analog converter according to the present invention. In FIG. 6, reference numeral 1 designates a digital input terminal, 2 an analog output signal terminal, 3 a terminal of a reference voltage Vref, $S_{L0}, S_{L1}, \ldots, S_{Ll-1}, S_{M0}, S_{M1}, \ldots, S_{Mm-1}$ analog switches, $C_{00}, C_{L0}, C_{L1}, \ldots, C_{Ll-1}$ capacitors in the LDAC 8, and $C_{M0}, C_{M1}, \ldots, C_{Mm-1}$ capacitors in the MDAC 7. The output of the LDAC 8 of l bits in the form of capacitor array $C_{00}, C_{L0}-C_{Ll-1}$ arranged in binary weighting corresponding to the bits of the digital input is coupled to the output of the MDAC 7 of m bits in the form of a capacitor array $C_{M0}-C_{Mm-1}$ arranged in binary weighting corresponding to the bits of the digital input by a coupling capacitor $C_c$. In the circuit arrangement, when the capacitance of the coupling capacitor $C_c$ including the capacitor array of the LDAC 8 on the LSB side, as seen from the right terminal of the coupling capacitor, is equivalently a unit capacitance, that is, $C_c = \{2^l/(2^l-1)\} \times$ (unit capacitance $C_o$), the DAC in question serves as a usual type DAC with a resolution of l+m bits, since the output signal of the LDAC 8 is multiplied by $\frac{1}{2}^l$ by the coupling capacitor $C_c$ and is added to the output of the MDAC 7. Thus, the analog addition of the outputs of the MDAC 7 and LDAC 8 is performed by the coupling capacitor $C_c$. Accordingly, the capacitance of the coupling capacitor $C_c$ determines the inclination of the input vs. output characteristic of the LDAC 8. More specifically, when the capacitance of the capacitor $C_c$ is greater than $\{2^l/(2^l-1)\} \times$ (unit capacitance $C_o$), the inclination of the characteristic curve is greater than that of the ideal curve. In this case, if the capacitance of the coupling capacitor $C_c$ is properly selected, a level change caused by a carry fron the LDAC 8 to the MDAC 7 always goes negative, even though an error caused by the MDAC 7 is considered. Accordingly, if the coupling capacitor $C_c$ is set at a value properly larger than the ideal value, i.e., $\{2^l/(2^l-1)\} \times$ (unit capacitance $C_o$), there occurs no positive jump in output characteristic of the original DAC. If a non-linearity error of the LDAC 8 is limited within $\frac{1}{2}$ LSB of the $2^l$ resolution and the capacitance of the coupling capacitor $C_c$ is so selected as to cover the error of the MDAC 7, there exists a level at which the linearity corresponds to 1 LSB of the LDAC 8 in the analog output. Therefore, a DAC with a satisfactory linearity is obtained by converting the digital input signal into a digital input of the original DAC capable of providing the satisfactory linearity.

Figure 7:
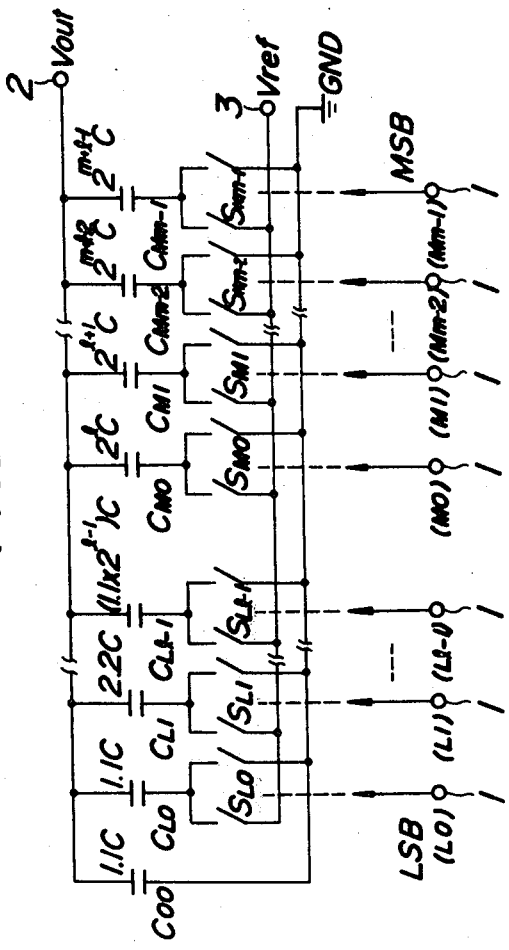
FIG. 7 is a circuit diagram showing another embodiment of a DAC according to the present invention.

FIG. 7 shows another DAC arrangement which is constructed by a single array of capacitor array, unlike the DAC in FIG. 6 having two separate capacitor arrays of the higher and lower order capacitors. Here, the analog switches $S_{L0}, S_{L1}, \ldots, S_{Ll-1}, S_{M0}, S_{M1}, \ldots, S_{Mm-1}$ are controlled as in FIG. 6 to perform a successive approximation. The capacitors $C_{00}, C_{L1}, \ldots, C_{Ll-1}; C_{M0}, C_{M1}, \ldots, C_{Mm-1}$ are assumed to be 1.1C, 1.1C, 2.2C, $\ldots$, $(1.1 \times 2^{l-1})$C; $2^l$C, $2^{l+1}$C, $\ldots$, $2^{m+l-1}$C, respectively. The lower order part having the capacitors $C_{00}, \ldots, C_{Ll-1}$ corresponds to the LDAC 8. The full scale of the lower order part is, for example, $(8.8C/128.8C) \cdot Vref$, when l=3 and is larger than one step in the capacitors $C_{M0}$ to $C_{Mm-1}$ in the higher order part corresponding to the MDAC 7, for example, $(8C/128.8C) \cdot Vref$, when m=4. The DAC in the present embodiment may be used instead of the MDAC 7 and LDAC 8 shown in FIG. 4 to form a similar DAC.

As described above, in the present invention, only the linearity of the LDAC is satisfied in the original DAC, and the capacitance of the coupling capacitor $C_c$ shown in FIG. 6, for example, is set larger than the ideal value so that the output signal always decreases at the time that a carry of the input code from the LDAC to the MDAC is formed. As a result, a existence of an output level of the DAC subject to the trimming can be fully ensured. Therefore, the DAC of the present embodiment largely mitigates the conditions of the original DAC which allow the digital trimming, that is, the matching tolerances of the weighting elements and the error due to the analog adder, so that the digital trimming is performed effectively. In principle, a calibration value or shift code can be obtained by simply adding in sequence level differences at the time that a carry of input code from the LDAC to the MDAC is formed. Accordingly, the trimming process is simple. Also in a case of a DAC having a capacitor array, a chip area for the DAc can be reduced by the degree of mitigation of the tolerances of the weighting elements, resulting in making the operating speed of the DAC high. Furthermore, a perfect calibration may in principle be attained by storing the number of carries of input code from the LDAC to the MDAC, or the number of bits of the MDAC, i.e., $2^m$ calibration values. Accordingly, the capacity of the memory circuit can be reduced. This also contributes to a reduction in the chip area of the DAC. Therefore, the DAC of the present invention can be fabricated in the form of an IC.

Figure 8:
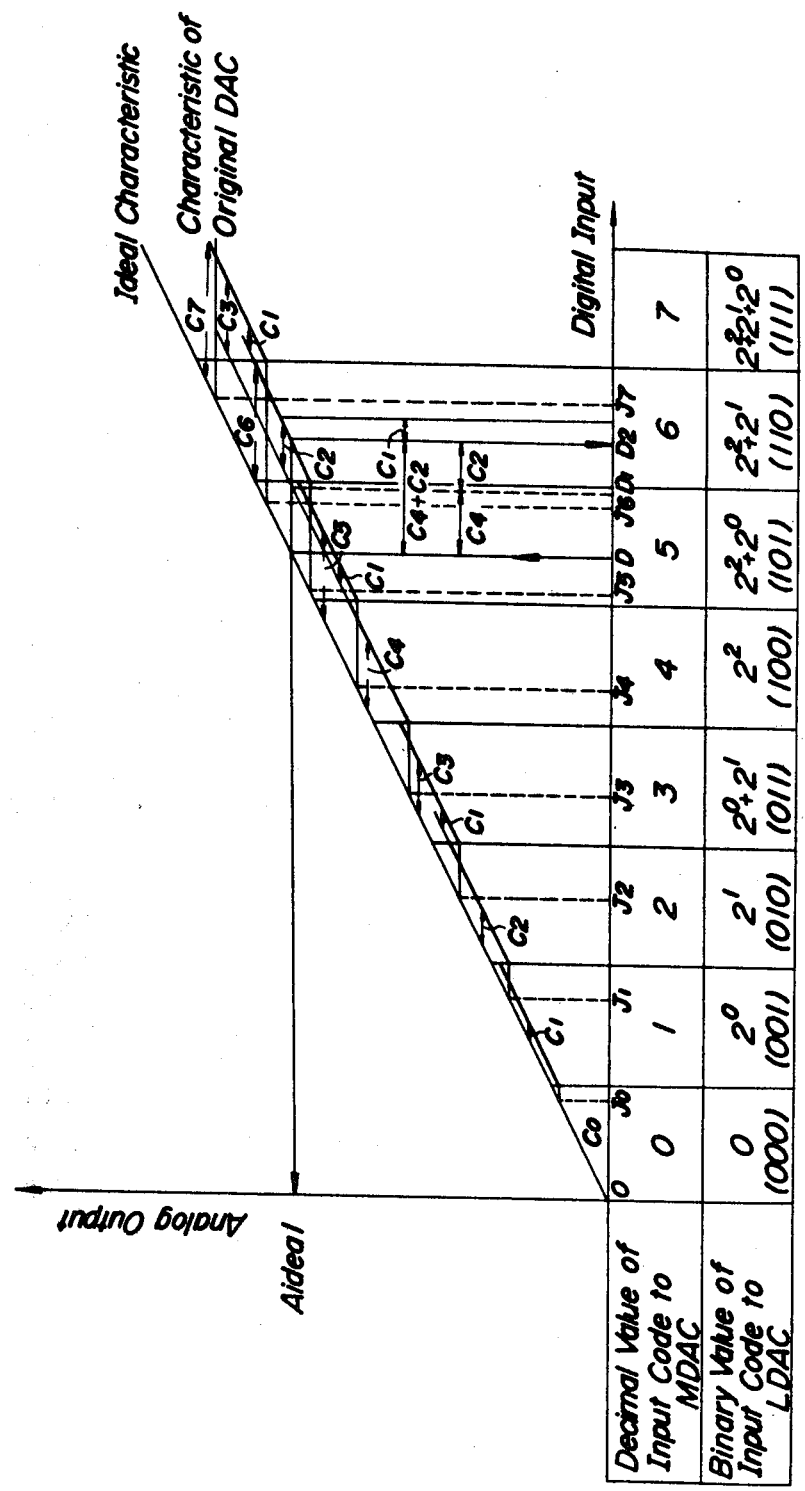
FIG. 8 is a graphic representation illustrating the characteristic of a 3-bit MDAC for explaining a principal of code conversion in another embodiment of the present invention.

An example of the characteristic of three bits in the MDAC is illustrated in FIG. 8. As seen from the figure, the output of the DAC always has a negative transition at every carry point of the input from the LDAC to the MDAC. In order to correct the characteristic to the ideal characteristic illustrated in FIG. 8, the following code conversion must be performed. It is assumed that the input codes at the change points of the calibration values are $J_0, J_1, J_2, \ldots$ The calibration values are selected depending on the input codes in such a way that a calibration value $C_0(=0)$ is selected for the input code 0 to $J_0$, the calibration value $C_1$ for the input code $J_0$ to $J_1$, and so on, and the thus selected calibration values are added to the input codes, respectively.

In this case, it is necessary to find a segment of those defined by $J_0$ to $J_1$, $J_1$ to $J_2$, ... to which an input code belongs. In principle, the input code is successively compared with the change point codes $J_0$, $J_1$, $J_2$, ..., $J_n$ to find a code $J_q$ which is smaller than the input code. Then, it is judged that the input code belongs to a segment $J_{q-1}$ to $J_q$. In an extreme case, however, the number of comparisons reaches the number of the change points $J_n$, or the number corresponding to the resolution of the MDAC. As a result, there is a disadvantage in that the above DAC requires a long processing time. In addition, fundamental comparison operation may be carried out in a manner such that data representing a change point is read out from a memory circuit and the 2's complement of the data is added to the input data. The comparison operation, however, needs an access time to the memory circuit, an inversion of the read out data and two addition processings, thus resulting in a further longer processing time. This causes a great hindrance to the reduction of the digital to analog converting time in the DAC of FIG. 4. Additionally, there are problems in that the construction of logical circuitry for executing the processing is complicated and that particularly the memory capacity of the memory circuit is increased.

In view of the above, explanation will be made of an embodiment of a digital to analog converter according to the invention which successfully solves the above problems, and has the capability of quickly determining a change point on the basis of a digital signal as a part of the input code, whereby to increase the digital to analog converting speed and to scale down the memory circuit.

Referring again to FIG. 8 for illustrating the principle of the code conversion in a DAC according to the present invention, there are plotted an ideal characteristic and a characteristic of the original DAC, with the change points of the calibration values denoted as $J_0$, $J_1$, $J_2$, ... and the calibration values or shift codes denoted as $C_0$, $C_1$, $C_2$, .... Also in the figure, the number m of bits of the MDAC is 3, i.e. m=3, and further contained are decimal values M of the input code and the binary values corresponding to the decimal values. An error $C_n$ at the time of each carry of the original DAC of n=m+1 bits as a combination of the MDAC of m bit and the LDAC of 1 bit is the sum of an error due to the connection of the MDAC to the LDAC and an error due to the weighting elements of the MDAC. If the former of those errors is designated by $T_M$ and the latter by $E_M$ corresponding to the codes of the MDAC, the following relation is obtained.

$$C_n = T_M + E_M \quad (1)$$

If the error of the DAC is caused by only the miss weighting of components or not dependent on the terminal voltage and branch current of the circuit elements in the DAC, the error components $T_M$ and $E_M$ are expressed as follows.

$$T_M = T \cdot M = T \cdot \left( \sum_{p=0}^{*} 2^{p-1} \right) \quad (2)$$

$$E_M = \left( \sum_{p=0}^{*} EB_p \right) \quad (3)$$

Here, T is a digital value corresponding to a negative transition of the output characteristics at the time of the carry of the input code from the LDAC to the MDAC and M is a code of the MDAC expressed in a decimal value. p designates an order of individual bits when the number of bits M(in the form a of decimal number) of the MDAC is developed into a binary form, and $$\sum_{p=0}^{*} 2^{p-1}$$

is the sum of codes forming 1, i.e., a binary-to-decimal converter value. $EB_p$ designates an error due to the weighting element when only each of the bits is 1.

$$\sum_{p=0}^{*} EB_p$$

is the sum of codes when the codes in the binary form corresponding to M is 1.

Using equations (2) and (3), equation (1) is rewritten as follows.

$$C_n = T \cdot \left( \sum_{p=0}^{*} 2^{p-1} \right) + \sum_{p=0}^{*} EB_p \quad (4)$$

$$= \sum_{p=0}^{*} (T \cdot 2^{p-1} + EB_p)$$

The errors $C_n$ are equal to each other when the MDAC codes are identical in the original DAC. Accordingly, for the shift code $C_M$ of the Mth bit, $C_n = C_M$. Further, since $T \cdot 2^{p-1} + EB_p$ is a shift code when only the pth bit of the MDAC is 1, so that, if this shift code is designated by $C_p$, equation (4) may be expressed by the following equation (5).

$$C_n = C_M = \sum_{p=0}^{*} C_p \quad (5)$$

The calibration value $C_n$ of an arbitrary input code is the total sum of the shift code $C_p$ of the MDAC codes in the input codes which are 1. Consequently, as illustrated in FIG. 8, $C_1 = C_1$, $C_2 = C_2$, $C_3 = C_1 + C_2$, $C_4 = C_4$, $C_5 = C_4 + C_1$, $C_6 = C_4 + C_2$, $C_7 = C_4 + C_2 + C_1$.

Figure 9:
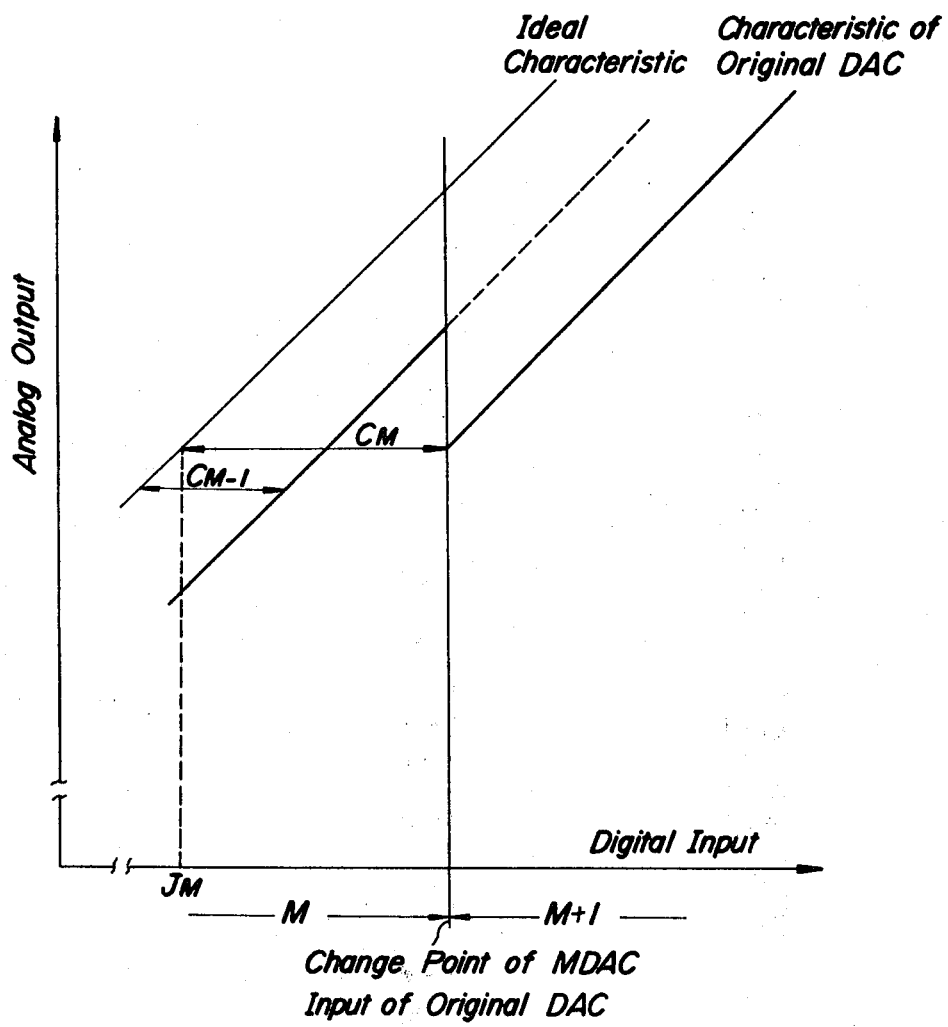
FIG. 9 is a representation of an enlarged part of the graph shown in FIG. 8.

FIG. 9 is an enlarged view of a change point of the MDAC input in the original DAC and its vicinal portion and, like FIG. 8, is useful for explaining the principle of the present invention. As seen from FIG. 9, a correct analog signal is obtained, if the input code M is larger than the code at the change point $J_M$, crossing the change point $J_M$, the calibration value $C_M$ is added to the input code M and the result of the addition is used as the original DAC input. In this case, a judgement whether the input code M is larger or smaller than the code at the change point $J_M$ raises a question. However, the shift code $C_M$ can be known previously. Therefore, if the calibration value $C_M$ is added to the input code M, and then the result of the addition is included in the region of M+1 in FIG. 9, it is judged that the input code M is larger than the code at the change point $J_M$.

Therefore, a calibration value can be obtained as follows. A calibration value or shift code is successively produced from a higher order bit when only the bit is 1, and the calibration value is added to the input code. Then, it is judged whether the value of the bit in question of the value as the results of the addition of the shift code to the input code is 1 or 0. When the value is 1, the shift code is accumulated to form the calibration value.

Figure 10:
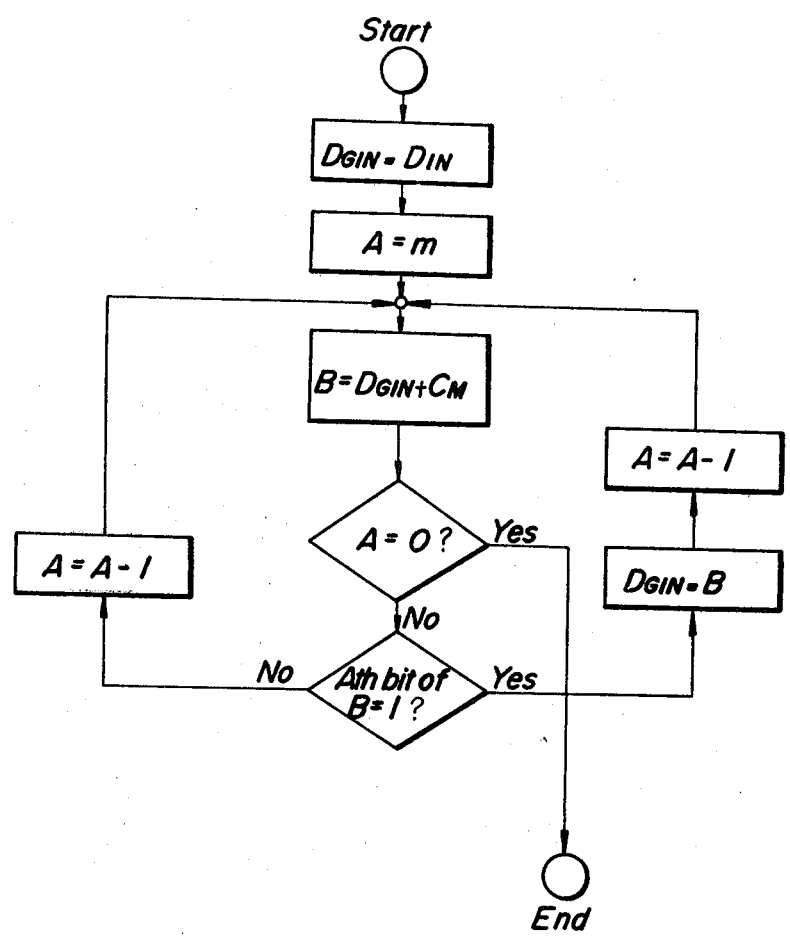
FIG. 10 is a flow chart explaining a procedure of code conversion in the present invention.

The flow of this code conversion procedure in the present invention based on the principle as mentioned above is illustrated in FIG. 10. In the flow chart, $D_{IN}$ represents an input code, $D_{GIN}$ a converted code (including a code after the conversion which is obtained at the end of the flow in FIG. 10), m the number of bits of the MDAC, and $C_M$ a shift code of the Ath bit. A calculation of the shift code will be explained by using an example where an ideal analog output is Aideal when D is applied as the digital input. First, the shift code $C_4$ is added to the digital input D. Since the corresponding bit in the MDAC at this time, i.e. the most significant bit (A=m=3) is 1, as seen from FIG. 8, the value D1 as a result of the addition of the shift code $C_4$ to the input code D is assumed to be the code $D_{GIN}$. Then, the shift code $C_2$ is added to the code $D_{GIN}$ to obtain an input code $D_2$. The corresponding bit in the code $D_2$, i.e., the second bit (A=3−1=2) as counted from the MSB as 1, as seen from FIG. 8. Accordingly, the code $D_{GIN}$ is modified to $D_{IN}+C_4+C_2$, with a further addition of the shift code $C_2$. That is, the shift code is $C_4+C_2$. Likewise, the third bit as counted from the MSB when the shift code $C_1$ is added to the $D_{GIN}$, or the $D_2$, is 0, so that the shift code is left $C_4+C_2$ with no addition of $C_1$, and the shift code $C_4+C_2$ is added to the input code D to obtain $D_2$ as the code $D_{GIN}$ after the conversion.

Figure 11:
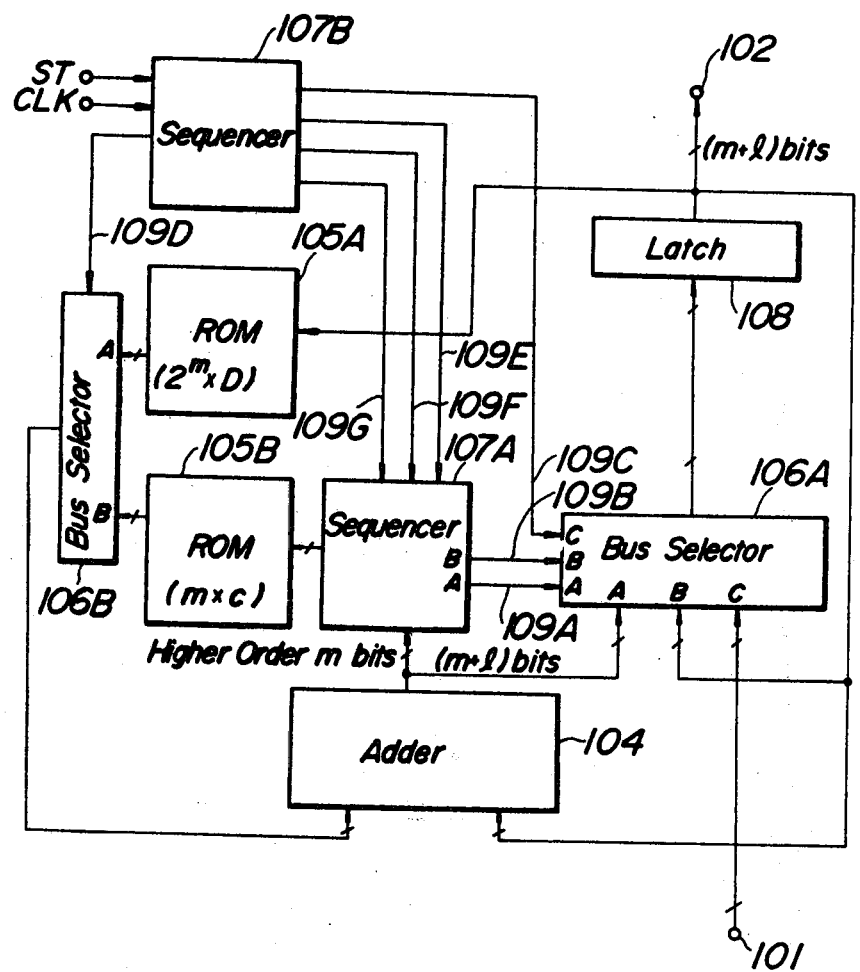
FIG. 11 is a block diagram showing an embodiment of a code converter in a DAC according to the present invention.

FIG. 11 shows an embodiment of a code converter in a digital to analog converter according to the present invention. In the figure, 101 designates a digital input terminal, 102 an analog output terminal, 104 a digital adder, 105A and 105B memory circuits in the form of, for example, ROMs, with memory capacities $2^m \times D$ (D means the number of bits capable of expressing a unit calibration value at the change point of the MDAC) and $m \times C$ (C indicates the number of bits capable of expressing a unit calibration value for each bit), respectively, 106A and 106B bus selectors, 107A and 107B sequencers, 108 a latch, and 109A to 109G control signal lines.

The table in FIG. 12 illustrates the operations at the respective portions in the circuit shown in FIG. 11 controlled by the sequencers 107A and 107B with relation to the states of the two bus selectors 106A and 106B. In the first step (1), a control signal is supplied from the sequencer 107B to the line 109C, 106A via the bus selector, thereby selecting the input terminal C. As a result, the input code $D_{IN}$ applied from the terminal 101 is latched in the latch 108. In the next step (2), the bus selector 106B selects the input terminal B, so that the ROM 105B is driven to read out an output signal, which is transferred to the adder 104 via the input terminal B of the bus selector 106B. In the adder 104, the output signal is added to the input code $D_{IN}$ which is latched in the latch 108. The shift codes when the individual bits are applied, for example, the shift codes $C_1$, $C_2$ and $C_4$ shown in FIG. 8 and $C_M$ in equation (5), are stored previously in the ROM 105B. The ROM 105B is controlled such that the shift codes are read out in sequence from the MSB. In the step (3), the sequencer 107A judges whether the content of a bit (A=the mth bit) corresponding to the MSB of the original DAC is 1 or 0 as a result of the addition. If the result of the addition is 1, the bus selector 106A is so controlled as to select the input terminal A and the result of the addition is transferred to the latch 108 where the result is latched. If the result of the addition is 0, the bus selector 106A is so controlled as to select the input terminal B and the input code remains a latched condition in the latch 108. In the step (4), the sequencer 107A directs a shift from the most significant bit to the next bit (A=A−1), and the steps (2) and (3) are again executed. Subsequently, the steps (2), (3) and (4) are repeated m times corresponding to the number of the higher order bits in the original DAC. The result of the addition is successively latched in the latch 108. Following this process, the step (5) is executed in which the bus selector 106B selects its inputs terminal A, so that the ROM 105A is driven to read out a content, which is added to the code obtained through the repetitive operations of the steps (2), (3) and (4). In order that an error when linearity is not ensured is incorporated into the original DAC to perform the calibration, the shift code due to the non-linearity error at that time is stored in the ROM 105A, corresponding to the input code to the original DAC. And through the process in the step (5), the addition as mentioned above is performed for the calibration. In the step (5), the bus selector 106B selects its input terminal A and the calibrated output is transferred to the latch 108 where the calibrated output is latched.

Figure 13:
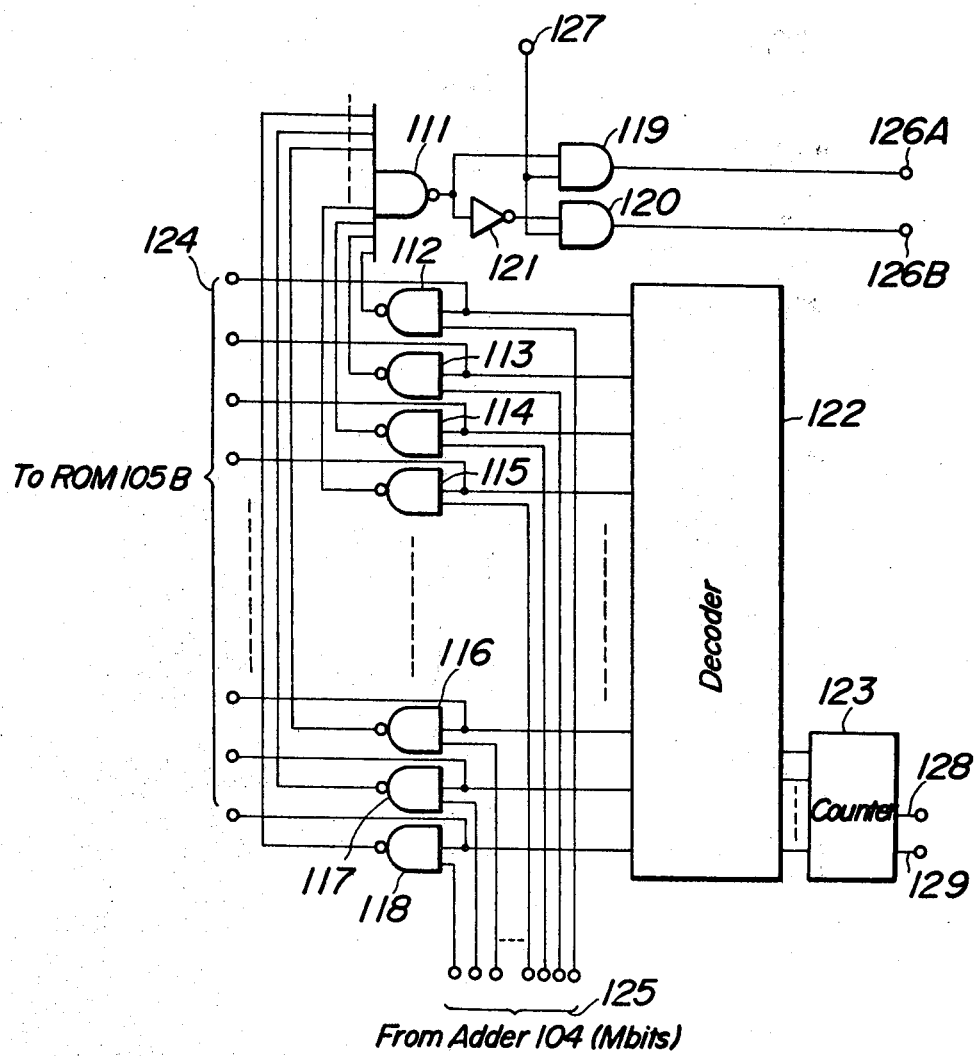
FIGS. 13 and 14 are circuit diagrams showing embodiments of the two sequencers shown in FIG. 11.

In the DAC circuit shown in FIG. 11, conventional suitable IC components commercially available on the market may be used for the adder 104, the ROMs 105A and 105B, the bus selectors 106A and 106B, and the latch 108. The sequencer 107A may be constructed as shown in FIG. 13, for example. In FIG. 13, reference numerals 111 to 118 designate NAND gates, 119 and 120 AND gates, 121 an inverter, 122 a conventional decoder, 123 a conventional binary counter of which the output is applied to the decoder 122. Reference numeral 124 generally indicates m ROM drive signal terminals for applying an output signal from the decoder 122 to the ROM 105B. Reference numeral 125 generally designates input terminals for receiving a signal corresponding to the higher order bits (m bits) in the output signal (m+1 bits) from the digital adder 104. Reference numerals 126A and 126B are select signal output terminals to the bus selector 106A. When the select signals at the terminals 126A and 126B are "1" and "0", respectively, the input terminal A of the bus selector 106A is selected. When the select signals are "0" and "1", respectively, the input terminal B of the bus selector 106A is selected. When the select signals at both terminals 126A and 126B are both "0", and if the signal on the signal line 109C is "1", the input terminal C of the bus selector 106A is selected. Reference numeral 127 designates a switch signal input terminal for switching between the input terminals A and B, and C of the bus selector 106A. The switch signal is transferred to the AND gates 119 and 120. Reference numeral 128 designates a clock input terminal to the counter 123 and reference numeral 129 represents a reset input terminal to the counter 123. The output signal from the decoder 122 and a signal from the terminal 125 are supplied to the NAND gates 112 to 118. The NAND output signals from the NAND gates 112 to 118 are applied to a multi-input NAND gate 111, the NAND output of which is directly applied to the AND gate 119 and through the inverter 121 to the AND gate 120. Respective signals to the terminals 127, 128 and 129 are supplied from the sequencer 107B which will be described in detail later with reference to FIG. 14.

Figure 15:
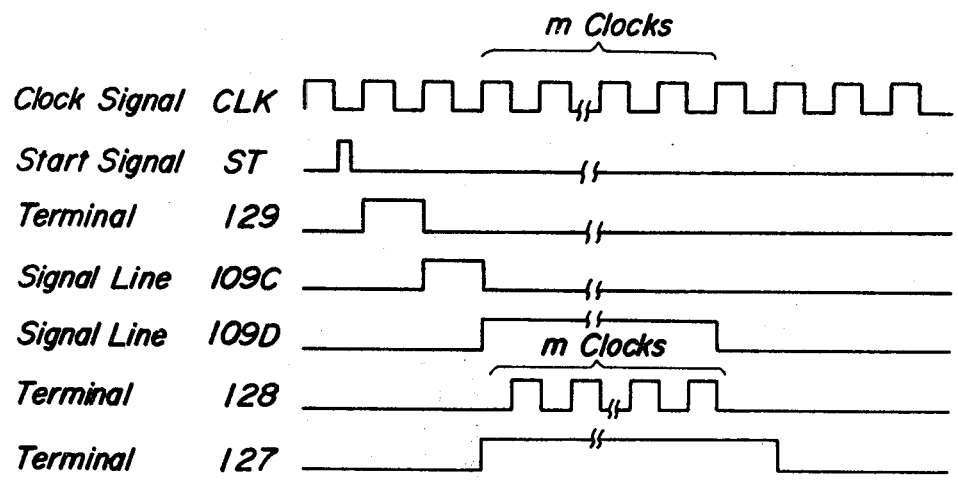
FIG. 15 is a timing chart illustrating a set of waveforms useful in explaining the operations of the sequencers shown in FIGS. 6 and 7.

A clock signal as illustrated in FIG. 15 is applied through the terminal 128 to the counter 123. The output signal from the counter 123 is supplied to the decoder 122 which in turn produces m decoder output signals successively from the largest value in response to the clock signal. In response to the respective decoder signals, the ROM 105B is driven to repeatedly execute the steps (2) to (4) shown in FIG. 12. The counts by the counter 123 are performed by the number m of bits of the MDAC. When the count of the counter 123 exceeds the number m of bits, the counter 123 is reset through the terminal 129. The addition output corresponding to the higher order bits m of the original DAC and the decoder output are applied through the NAND gates 112 to 118 to the NAND 111. Then, if the corresponding bit value is "1" as a result of the digital addition, the NAND gate 111 produces a "1" output signal.

Figure 14:
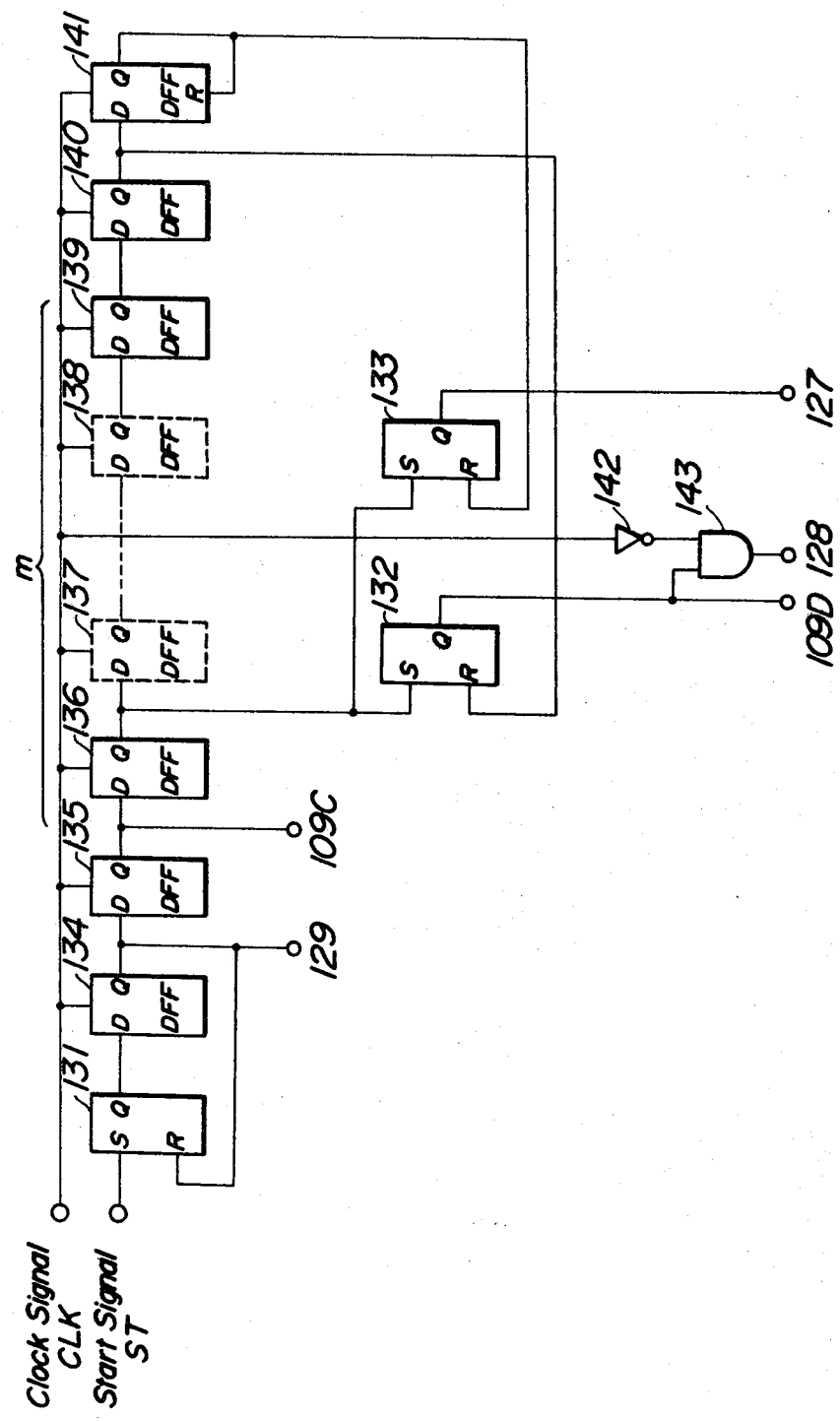

FIG. 14 shows an embodiment of a circuit arrangement of the sequencer 107B, in which reference numerals 131, 132 and 133 are RS flip-flops, 134 to 141 D flip-flops with reset, 142 an inverter, and 143 an AND gate. The flip-flops 131, 134, 135, . . . , 140, 141 are connected in cascade and a start signal ST is applied to a set input terminal of the first stage flip-flop 131 from an external source. A clock signal CLK is applied to the flip-flops 134 to 141 and the inverter 142 from the external source. A Q output signal from the flip-flop 134 is applied to the terminal 129 and also to the reset input terminal of the flip-flop 131. A Q output signal of the flip-flop 135 is transmitted to the signal line 109C. A Q output from the flip-flop 136 is applied to the reset input terminals of the flip-flops 132 and 133. A Q output of the flip-flop 140 is applied to the reset input terminal of the flip-flop 132. A Q output of the flip-flop 141 is supplied to its reset input terminal and the reset input terminal of the flip-flop 133. A Q output of the flip-flop 132 is applied to the signal line 109D and the AND gate 143, and a Q output of the flip-flop 133 is supplied to the terminal 127. An output signal from the inverter 142 is applied to the AND gate 143 of which the output signal is supplied to the terminal 128. It is assumed that the number of flip-flops 136 to 139 is m and, when the MDAC has 8 bits, m=8.

By supplying the clock signal CLK and the start signal ST as illustrated in FIG. 15 to the sequencer 107B shown in FIG. 14, signals as illustrated in FIG. 15 appear at the terminals 127, 128 and 129, and on the signal lines 109C and 109D.

As described above, the code converter in the present invention produces a digital signal of (m+1) bits in which the code of the digital input signal $D_{IN}$ is calibrated. The digital output from the code converter is applied to the MDAC 7 and the LDAC 8 as shown in FIG. 6 or the higher order and the lower order portions of the single DAC as shown in FIG. 7.

According to the present invention, with the above-mentioned arrangement of the code converter, the capacity of the memory circuit can remarkably be reduced. The capacity of the memory circuit in the present invention is expressed as (number of bits of the MDAC)×(the number of bits representing the shift code), when the DAC has no non-linearity error generated by a cause except weighting of component. In case all of the change points and the shift codes are stored corresponding to the resolution of the MDAC, the capacity of the memory circuit is (resolution of the MDAC)×(the number of bits representing the shift code)+(resolution of the MDAC)×(the number of bits representing the change points). Therefore, it is seen that the memory capacity is remarkably reduced according to the present invention. When the DAC has only the error caused by miss weighting component, the memory capacity is (the number of the MDAC)×(the number of bits representing the shift code of each bit)+(resolution of the MDAC)×(number of bits representing the shift code corresponding to the non-linearity error). A shift code with respect to an arbitrary code depends largely on the negative transition, but little on the non-linearity error. When one negative transition is 10 LSB and the number of bits of the MDAC is 8 bits, the maximum negative transition is 256×8 LSB, i.e. corresponding to 11 bits, while the non-linearity error can be limited within 3 to 5 bits. Accordingly, the improvement of the non-linearity error is also remarkable in this case.

In the present invention, it is sufficient that the memory circuit is accessed by the times equal to the number of bits of the MDAC and that the read out output signal is processed for addition and so on. Accordingly, the converting time is remarkably reduced compared with a case in which access is made to the memory circuit which stores the change points by the times equal to the number corresponding to the resolution of the MDAC, so that the read out output is compared with the input code, as in the DAC in which all of the change points and the shift codes are stored corresponding to the resolution of the MDAC.

Figure 16:
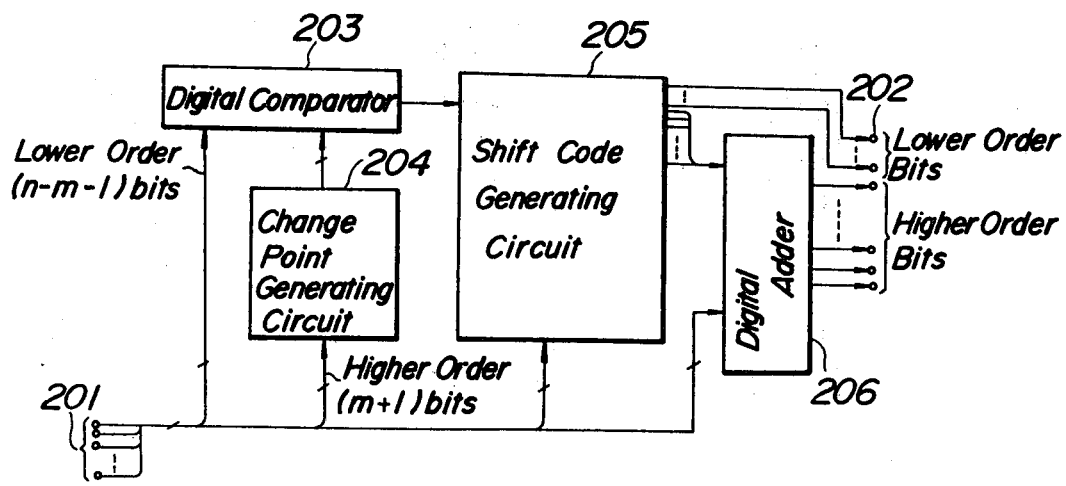
FIG. 16 is a block diagram showing the fundamental construction of a code converter in a DAC according to the present invention.
Figure 17:
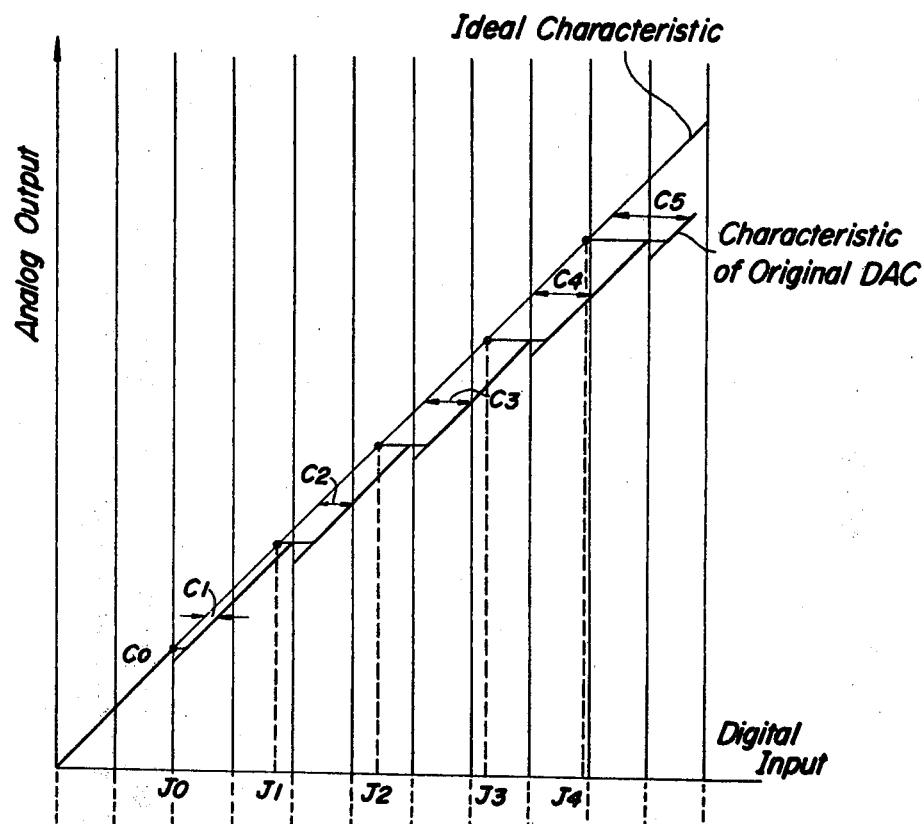
FIG. 17 is a graphical representation which is useful in explaining the principle of code conversion according to the present invention.

FIG. 16 shows another embodiment of a code converter used in a digital to analog converter according to the present invention. In the figure, reference numeral 201 designates a digital input signal terminal, 202 a code conversion output signal terminal to the original DAC, 203 a digital comparator, 204 a change point generating circuit, 205 a shift code generating circuit, and 206 a digital adder. For explaining the operation of the circuit, it is assumed that the number of bits of the original DAC is n, the number of bits of the MDAC in the original DAC is m, and the number of bits of the LDAC is l=n−m. When the number of bits after calibration is k, the number of bits after the calibration is apparently smaller than that before the calibration. Therefore, k<n. Areas in FIG. 17 correspond to a resolution two times higher than the resolution $2^m$ of the MDAC in the original DAC, i.e., $2^{(m+1)}$, so that the areas can be discriminated by a signal of the higher order (m+1) bit in the input code. Thus, as shown in FIG. 17, a signal of the lower order [n−(m+1)] bits at the change points codes $J_0, J_1, J_2, \ldots$ is previously stored in the change point generating circuit 204, such as a ROM, corresponding to a signal of the higher order (m+1) bits in the input code. If no change point exists in that area, 0 is stored in the circuit 204. Likewise, the shift code $C_0=O, C_1, C_2, \ldots$ in that area is previously stored in the shift code generating circuit 205, corresponding to a signal of the higher order (m+1) bits.

When the digital input code is applied to the terminal 201, the signal of the higher order (m+1) bits is supplied to the change point generating circuit 204, so that an area is designated. The change point generating circuit 204 produces a signal of the lower order (n−m−1) bits when a change point exists in the area, and when the change point does not exist in the area, the generating circuit 204 produces 0. The digital comparator 203 compares the code data of lower order (n−m−1) bits in the digital input signal with the output signal from the change point generating circuit 204. When the input code data is larger than the output signal, a carry signal is produced from the digital comparator 203. That is, when a change point exists in the area, two kinds of shift codes exit in the area, and therefore a desired one is elected from the two shift codes through the comparing operation. If it is assumed that the smaller shift code of those shift codes is stored corresponding to the area in the shift code generating circuit 205, the shift code generating circuit 205 is so driven to produce that stored shift code when the input code is small, and to produce a shift code corresponding to the next area when the input code is large. On the other hand, when the larger shift code of those shift codes is stored corresponding to the area in the code shift generating circuit 205, the shift code generating circuit 205 is so driven to produce that stored shift code when the input code is large, and to produce a shift code corresponding to the preceding area when the input code is small. Through the above operation, a shift code for calibrating an input code corresponding to each input code can be obtained from the shift code generating circuit 205. Finally, the shift code and the input code are added by the digital adder 206 and the addition output is applied to the original DAC (not shown), as a calibrated input code calibrated corresponding to the input code, so that the original DAC produces an analog output correctly corresponding to the input code. Incidentally, the number of bits of the input code is smaller than that of the original DAC and the shift code is set at the resolution of the original DAC, so that the adder 206 performs addition in a manner such that the MSBs are coincident with each other.

Figure 18:
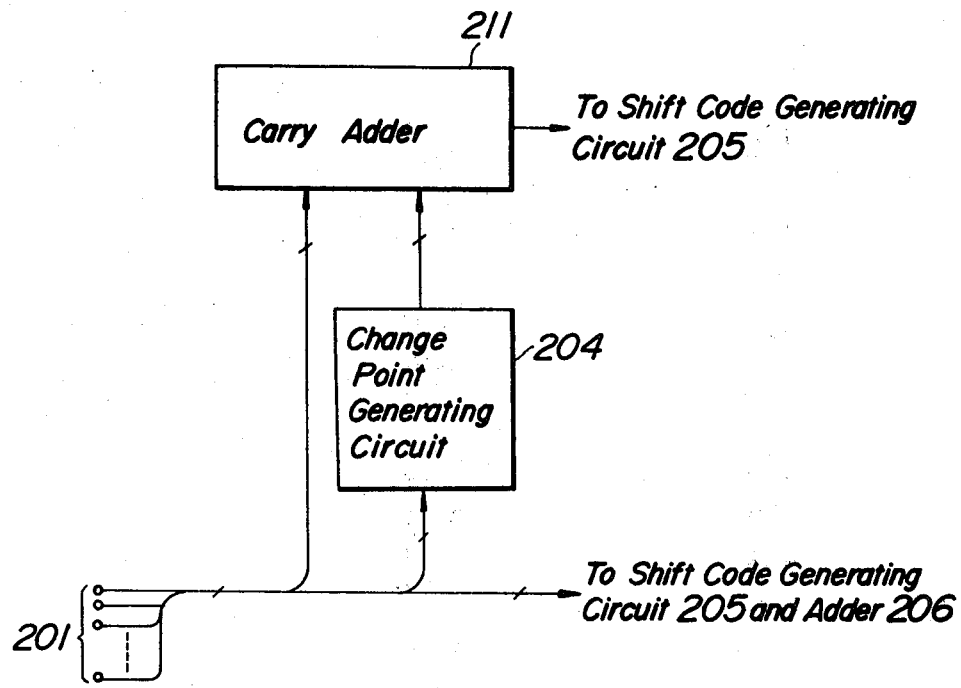
FIG. 18 is a block diagram showing an embodiment of a digital comparator shown in FIG. 16.

FIG. 18 shows a block diagram of an embodiment of the digital comparator 203, in which reference numeral 211 is a carry adder for producing only a carry signal. The change point generating circuit 204 in the present embodiment is constructed by a memory circuit for storing the 2's compliments. In the carry adder 211, the 2's compliment of one of the A-bit digital values is added to the other A-bit digital value, and the digital comparison is performed by judging whether there is a carry output to the (A+1)th bit of the addition result. Thus, the comparing operation can be realized by storing the 2's compliment of the digital code of the lower order (n−m−1) bits in the digital code at a change point into the change point generating circuit 204, and by simply using the carry adder 211.

Figure 19:
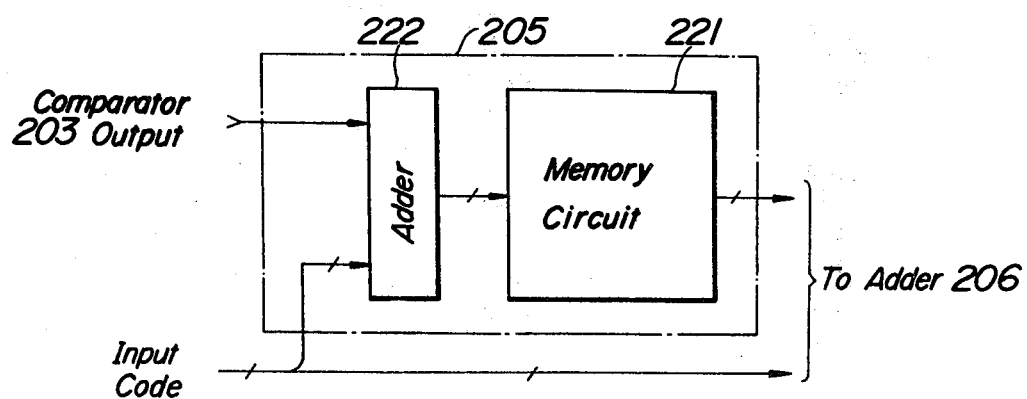
FIGS. 19, 20 and 21 are block diagrams showing three embodiments of the shift code generator.

Three embodiments of the shift code generating circuit 205 will be described with reference to FIGS. 19, 20 and 21. In those embodiments, it is assumed that the smaller shift code is stored with respect to an area. In FIG. 19, reference numeral 221 is a memory circuit and 222 an adder. The shift codes are successively stored in the memory circuit 221, corresponding to a signal of the higher order (m+1) bits in the input code. When the data of the lower order (n−m−1) bits in the input code is larger than the value at the change point, a logical "1" is applied from the comparator 203 to the adder 222 and this logical "1" is added to the input code from the terminal 1. This means that the area of the shift code is shifted by one, whereby a correctly calibrated shift code is obtained from the memory circuit 221. In a converse case, the comparator 203 produces a logical "0" and the shift code in the area is obtained from the memory circuit 221.

Figure 20:
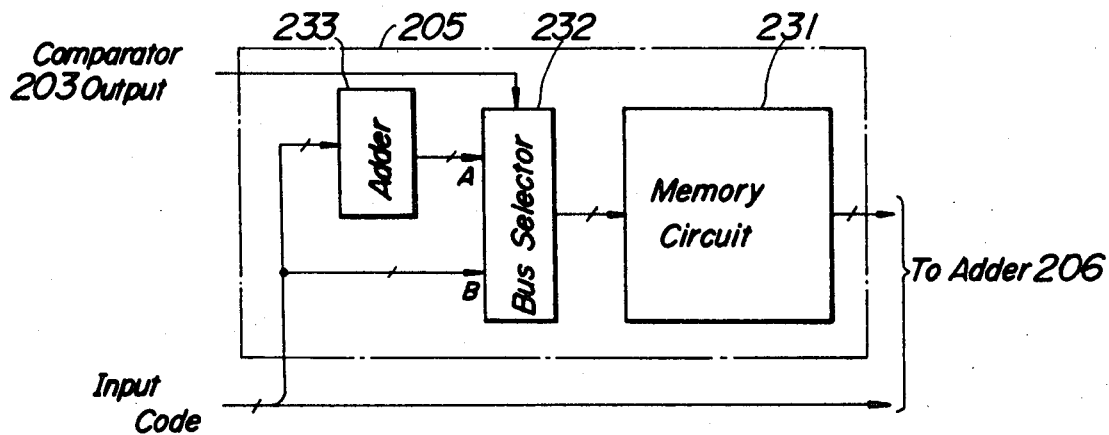

In the embodiment shown in FIG. 20, the addition operating speed in FIG. 19 does not influence the circuit operation thereby speeding up the converting operation. The shift code generating circuit 205 is comprised of a memory circuit 231, a bus selector 232 and an adder 233 for previously performing the addition of +1. Also in the present embodiment, like the embodiment of FIG. 19, when the comparator output is "1", a signal in which +1 is always applied to the input code is selected by the input terminal A of the bus selector 232 to access the memory circuit 231. Accordingly, the shift code in the next area corresponding to the input code can be obtained from the memory circuit 231. In a reverse case, the input terminal B of the bus selector 232 is selected, so that the shift code corresponding to the input code is produced from the memory circuit 231. In this arrangement, the operating speed of the bus selector, instead of the response time of the adder 222 in the embodiment of FIG. 19, contributes to the overall code converting speed. Normally, the operating time of the bus selector can be made shorter, so that the code converting speed can be made faster by the same amount.

Figure 21:
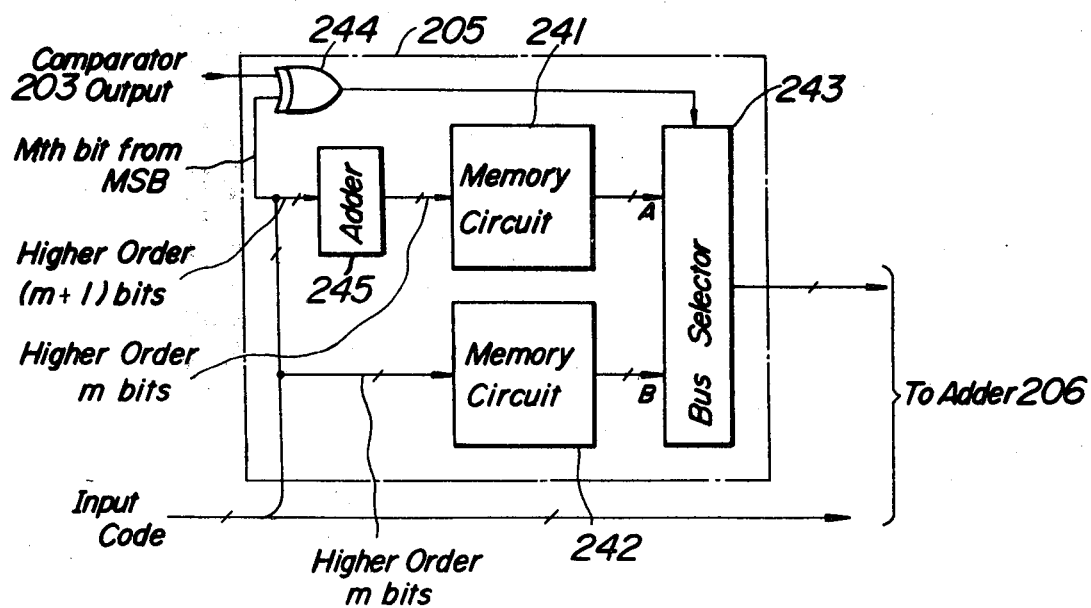

The embodiment in FIG. 21 is designed so as to eliminate the effect of the delay times of the adder and the memory circuit thereby improving the code converting time. The shift code generating circuit 205 is comprised of two memory circuits 241 and 242, a bus selector 243, an exclusive OR gate 244 and an adder 245 for always adding +1. A proper calibration value corresponding to the higher order n bits in the input code is stored in the memory circuit 242, as will be described later. The data of higher order (m+1) bits in the input code is supplied to the adder 245 where +1 is added to the data, and from the result of the addition, a borrow of one bit is performed, so that an output of the higher order m bits is obtained. Corresponding to this m bit output, a proper calibration value or shift code is written in the memory circuit 241, as will be described later. Supplied to the exclusive OR gate 244 are a signal of the mth bit as counted from the MSB in the input code and the output signal from the comparator 203. An exclusive OR output signal from the exclusive OR gate 244 is applied as a select signal to the bus selector 243. Supplied to the input terminals A and B of the bus selector 243 are the output signals read out from the memory circuits 241 and 242, respectively. As a result, either of the read out signals is selected in accordance with a select signal and then is supplied to the adder 206.

Figure 22:
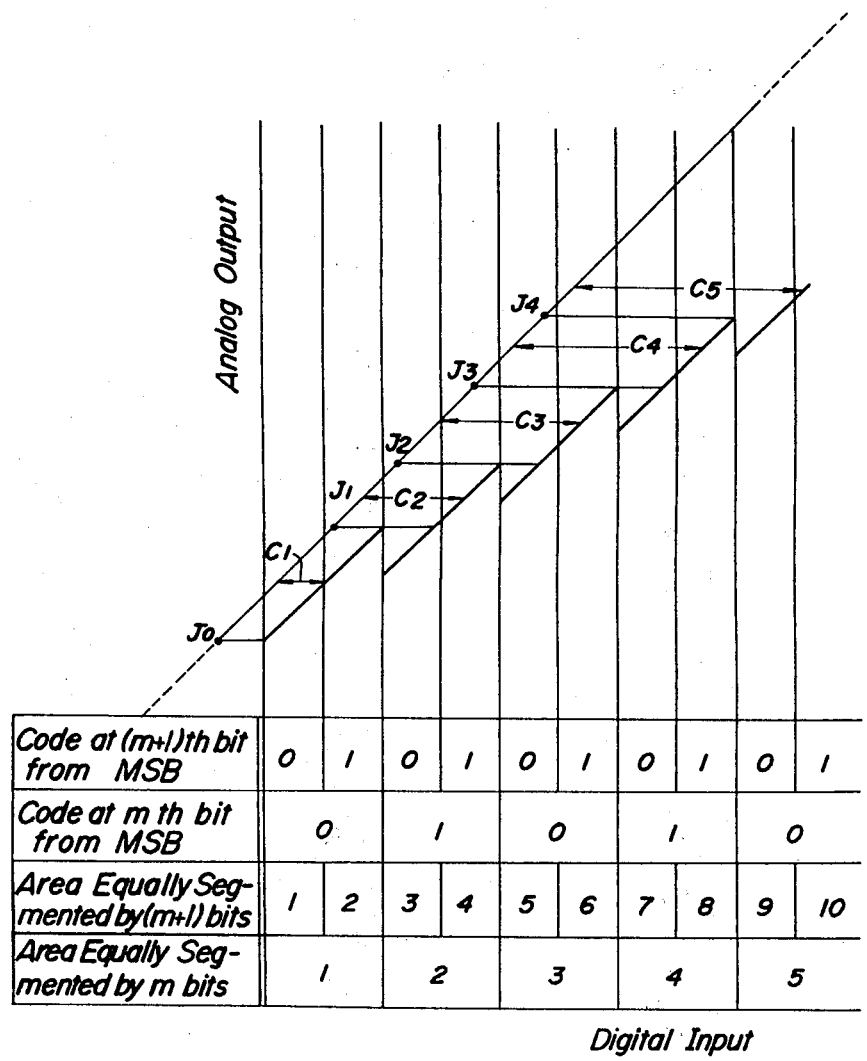
FIG. 22 is a graphical representation for explaining the principle of operations of the shift code generator shown in FIG. 21.

The operation of the circuit arrangement shown in FIG. 21 will be described with reference to FIG. 22. In FIG. 22, there are plotted the relationship between an area equally segmented by the resolution of m bits of the MDAC and shift codes and change points, and the relationship between an area equally segmented by the resolution of (m+1) bits which is two times higher than that of the MDAC and shift codes and change points. Let us consider an area 2 equally segmented by m bits. The area 2 has two change points $J_2$ and $J_3$, and its area can take three shift codes $C_2$, $C_3$ and $C_4$. The change points are discriminated as $J_2$ and $J_3$ for the areas 3 and 4 equally segmented by the resolution of (m+1). Accordingly, when the code of the (m+1)th bit counted from the MSB is "0", the shift code is $C_2$, if the lower order (n−m−1) bits in the input code is smaller than the code of the lower order (n−m−1) bits at the change point $J_2$. On the other hand, if the former is larger than the latter, the shift code is $C_3$. In case where the code of the $(m+1)$th bit from the MSB is "1", the shift code is $C_3$, if the lower order $(n-m-1)$ bits in the input code is smaller than the code of the lower order $(n-m-1)$ bits at the change point $J_2$. On the other hand, if the former is larger than the latter, the shift code is $C_4$. When an area equally segmented by m bits contains two shift codes, the larger shift code of those two codes is stored in the memory circuit 242. When the area contains three shift codes, the intermediate shift code, i.e. $C_3$ in this case, is stored in the memory circuit 242, and the shift code which is the lowest in the order, i.e. $C_2$ in this case, is stored in the other memory circuit 241. $C_3$ is stored in the next area in the memory circuit 242. Accordingly, the possible shift codes $C_2$, $C_3$ and $C_4$ can be discriminated by driving the memory circuit 241 by the m bit signal in the input code. The case of the shift codes $C_2$ and $C_3$ or the shift codes $C_3$ and $C_4$ can be discriminated depending on whether the value of the $(m+1)$ bits in the input code is even or odd. Further, the combination of $C_2$ and $C_3$ or $C_3$ and $C_4$ can be discriminated by the output from the comparator 203 and depending on whether the value of the $(m+1)$ bits in the input code are 1 or 0. Whether the value of the $(m+1)$th bit in the input code is 1 or 0 can be judged by checking whether or not there is a carry in the next bit when $+1$ is added to the value of the $(m+1)$th bit.

When the value is 1, the adder 245 has no carry and the input code to the memory circuit 241 is coincident with the input code to the memory circuit 242. In this case, the memory circuit 241 produces the shift code $C_2$. In the case that the value is 0, the adder 245 has a carry and the address in the memory circuit 241 is shifted by 1, so that the shift code $C_4$ is produced from the memory circuit 241. The memory circit 242 produces the shift code $C_3$ regardless of the 0 or 1. Therefore, in accordance with an 0 or 1 of the signal of the higher order $(m+1)$ bits in the input code, the calibrated values of the two combinations, that is, $C_2$ and $C_3$ and $C_3$ and $C_4$, are respectively produced from the memory circuits 241 and 242. The discrimination of the combination of $C_2$ and $C_3$ or $C_3$ and $C_4$ can be realized by obtaining an exclusive OR output signal of the comparator output signal and the signal of the $(m+1)$th bit in the input signal, as shown in FIG. 21. Thus, in the construction shown in FIG. 21, the memory circuits 241 and 242 are operated concurrently with the operation of the memory circuit 204 for producing the change points. Accordingly, the operating speed of the overall code converter is determined by the slower operating speed of those of the memory circuit 204 or the memory circuits 241 and 242. The operating speed of the memory circuit as the change point generating circuit 204 is substantially in the same order as that of those memory circuits. Consequently, as the shift code generating circuit 205, it is seen that the circuit arrangement of FIG. 21 allows a lower speed memory circuit than the circuit arrangement shown in FIG. 19 or 20. The whole capacity of the memory circuits 241 and 242 in FIG. 21 is $2^{m+1} \times K$ (K: the number of bits capable of expressing the shift code), as in the case of FIG. 19 or 20.

Figure 23:
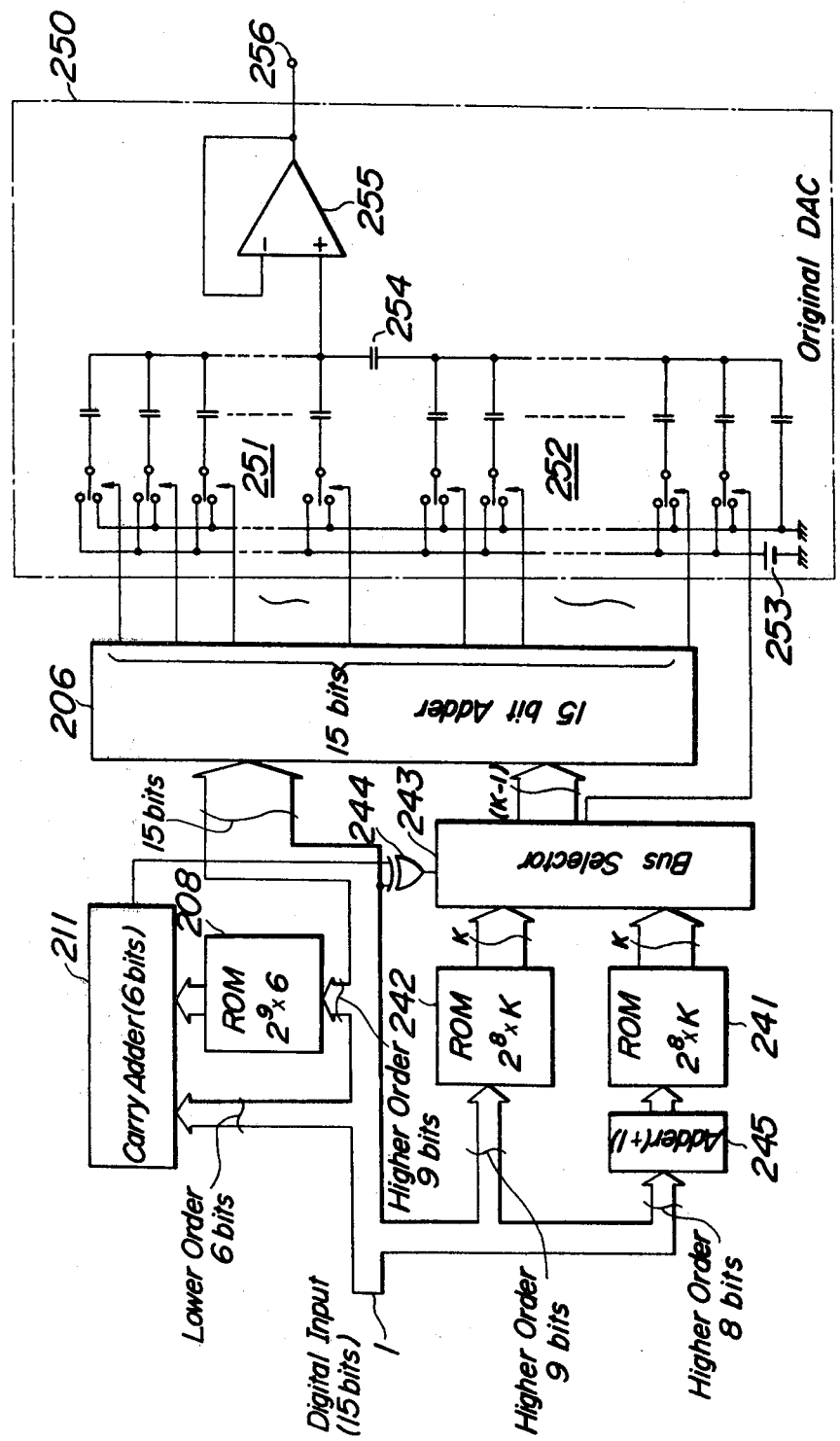
FIG. 23 is a block diagram showing another embodiment of a DAC according to the present invention.

Referring now to FIG. 23, there is shown an embodiment of a digital to analog converter according to the present invention. In the figure, this digital to analog converter uses the respective portions, the details of which are disclosed in FIGS. 16, 18 and 21 and thus like reference numerals are used to designate corresponding portions in FIGS. 16, 18 and 21. In the circuit arrangement, an output signal from the digital adder 206 of 15 bits is supplied to an original DAC 250. The original DAC 250 in this illustrated embodiment has an MDAC 251 and an LDAC 252, each including a series of capacitors forming a capacitor array and an analog switch array, a reference voltage source 253, a coupling capacitor 254 and an operational amplifier 255. An analog conversion output signal is derived from an output terminal 256.

In the arrangement, if the full scale of the LDAC 252 is larger than 1 LSB of the MDAC 251 and its linearity is satisfied at the resolution of the LDAC 252, there is obtained a characteristic in which the analog output decreases at the time of a carry of input code from the LDAC 252 to the MDAC 251. A negative transition occurrs at the time of a carry of input code from the LDAC 252 to the MDAC 251 and the overall characteristic is plotted as the curve where the characteristic curve of the LDAC 252 is superposed on the characteristic of the LDAC 251, from a starting point where the carry of input code is generated from the LDAC 252 to the MDAC 251. In this arrangement, a characteristic with a satisfactory linearity can be obtained by shifting the digital input by the code converter.

In FIG. 23, the upper order bits and the lower order bits in the original DAC 250 are each 8 bits and the code converter performs the calibration, whereby a 15-bit digital to analog converter is formed. The D/A converting speed in this embodiment is determined by the sum of the respective speeds of the ROMs 241 and 242, the carry adder 211, the bus selector 243, the 15-bit adder 206 and the original DAC 250. For example, when the digital to analog converter shown in FIG. 23 is fabricated in the form of an LSI by using a usual CMOS process, the operation speeds of the respective portions are 300 to 500 ns, 100 ns, 100 ns, 100 ns, and 1 to 1.5 $\mu$s. Further, the operating speeds of the original DAC 250 of 1 to 1.5 $\mu$s will be described later. As a result the overall converson time is 1.6 to 2.3 $\mu$s, or about 400 to 600 ksps (kilo samples per second).

The DAC of the present embodiment is effective particularly when the speed of the ROM is slow. With respect to the speed of the original DAC, if a unit capacitor in the capacitor series is 1 pF, the element accuracy in the LSI is about 1.26% and an error in the lower order 8 bits is 0.04 LSB, so that the condition of the calibration in the present invention is satisfied sufficiently. The settling of the capacitor array may be about 500 to 700 ns, although it depends on the dimension of the switches. The operating speed of the adder may be about 500 to 800 ns, and thus the operating time of the whole original DAC is about 1 to 1.5 $\mu$s.

Such a remarkable speed improvement can be attained also in the case of using the shift code generating circuit shown in FIG. 19 or 20.

The MDAC 251 and the LDAC 252 in the original DAC 250 shown in FIG. 23 may use the circuit arrangement shown in FIG. 6 or 7.

As seen from the foregoing description, in the present invention switching of the shift code can be performed within a short time on the basis of a digital signal which is a part of the input code, so that the DAC with a high resolution and a high accuracy can be fabricated in the form of an LSI with a further improvement of the converting speed of the DAC.

What is claimed is:

1. A digital to analog converter for converting a digital input signal to an analog output signal comprising:
  a first digital to analog converter for generating an output of higher order bits, said first digital to analog converter including a first capacitor array having capacitors arranged with binary weighting corresponding to a train of higher order bits of said digital input signal and a first analog switch array having analog switches for selectively connecting one terminal of each of said capacitors of said first capacitor array to a reference voltage or ground;
  a second digital to analog converter for generating a full scale output as an output signal of lower order bits which is always larger than every quantizing level of said first digital to analog converter, said second digital to analog converter including a second capacitor array having capacitors arranged with binary weighting corresponding to a train of lower order bits of said digital input signal and a second analog switch array having analog switches for selectively connecting one terminal of each of said capacitors of said capacitor array to said reference voltage or ground, the other terminals of said capacitors in said first capacitor array being connected in common to an output point of said first digital to analog converter and the other terminals of said capacitors in said second capacitor array being connected in common to an output point of said second digital to analog converter;
  a coupling capacitor coupling the output points of said first and second digital to analog converters, the equivalent capacitance formed by said second digital to analog converter and said coupling capacitor across the output point of said first digital to analog converter being larger than the unit capacitance of said first digital to analog converter;
  output means having its input coupled to the output point of said first digital to analog converter for generating at its output said analog output signal; and
  a code converter for applying to said first and second digital to analog converters an input code obtained by shifting said digital input signal by a predetermined value such that the relationship between said digital input signal and said analog output signal is substantially linear.

2. A digital to analog converter as claimed in claim 1, wherein said code converter comprises:
  a first memory circuit for storing a shift code when only one bit of a plurality of bits forming said input code to said first digital to analog converter is 1;
  a digital adder for sequentially performing digital addition of the shift code read out from said first memory circuit;
  a first selector for selectively deriving one of said input code, the preceding addition output and the present addition output from said digital adder;
  a latch for latching an output signal selectively derived from said first selector to apply the latched output as an output signal from said code converter to said first and second digital to analog converters; and
  a sequencer for controlling so as to read out from said first memory circuit the shift code sequentially from a shift code with respect to higher order bits of the plurality of bits, to judge whether or not the shift code when only one bit of said plurality of bits forming said input code to said first digital to analog converter is 1 is added to said input code, and to accumulate said shift code when the addition is made, thereby to add the accumulated output to said input code and to latch the addition output in said latch.

3. A digital to analog converter as claimed in claim 1, in which said code converter comprises:
  a first memory circuit for storing a shift code when only one bit of a plurality of bits forming said input code to said first digital to analog converter is 1;
  a second memory circuit for storing the shift code with respect to a non-linearity error that is generated by a cause except miss weighting components and corresponding to an input code to said first digital to analog converter;
  a digital adder/subtractor for sequentially performing digital addition/subtraction of the shift code read out from said first memory circuit;
  a first selector for selectively deriving one of said input code, the preceding addition/subtraction output and the present addition/subtraction output from said digital adder/subtractor;
  a second selector for selecting one of the outputs of said first and second memory circuits;
  a latch for latching an output signal selectively derived from said first selector to apply the latched output as an output signal from said code converter to said first and second digital to analog converters; and
  a sequencer for controlling so as to read out from said first memory circuit the shift code sequentially from a shift code with respect to higher order bits of the plurality of bits, to judge whether or not the shift code when only one bit of said plurality of bits forming said input code to said first digital to analog converter is 1 is added to/subtracted from said input code, to accumulate said shift code when the addition is made, thereby to add/subtract the accumulated output to/from said input code and to latch the addition/subtraction output in said latch; whereby
  said digital adder/subtractor responds to the code converter output signal from said latch to read out the shift code based upon the non-linearity error from said second memory circuit, and performs an addition when said shift code is positive, and a subtraction when said shift code is negative.

4. A digital to analog converter as claimed in claim 1, wherein said code converter comprises:
  a change point generating circuit for previously storing, corresponding to each area of each digital quantity obtained by equally segmenting a digital to analog converting characteristic of said original digital to analog converter by a resolution two times higher than that of said first digital to analog converter, a change point where a shift code in the corresponding area in the characteristic calibrated by the shift code in said code converter is changed, and for responding to a part of said digital input signal to read out data of said change point;
  a comparing circuit for comparing said part of said digital input signal with said data of said change point from said change point generating circuit to designate the selection of either one of the two shift codes when there are two kinds of shift codes in said area;

a shift code generating circuit for previously storing, corresponding to said area, the shift code when there is one kind of shift code in the corresponding area and the shift code designated by said comparing circuit when there are two kinds of shift codes in said corresponding area, and for responding to said digital input signal to read out a predetermined shift code; and an adder for performing digital addition of said shift code read out from said shift code generating circuit and said digital input signal thereby supplying the result of said addition to said first and second digital to analog converters.

* * * * *